US012685001B2

(12) United States Patent
Hsieh et al.

(10) Patent No.: US 12,685,001 B2
(45) Date of Patent: Jul. 14, 2026

(54) DISPLAY PANEL COMPRISING ANTI-PEEP DISPLAY MODE, MANUFACTURING METHOD THEREFOR, AND DISPLAY DEVICE

(71) Applicant: BOE Technology Group Co., Ltd., Beijing (CN)

(72) Inventors: Mingche Hsieh, Beijing (CN); Yu Feng, Beijing (CN); Wenxiu Zhu, Beijing (CN); Renrong Gai, Beijing (CN)

(73) Assignee: BOE Technology Group Co Ltd, Beijing (CN)

( * ) Notice: Subject to any disclaimer, the term of this patent is extended or adjusted under 35 U.S.C. 154(b) by 392 days.

(21) Appl. No.: 18/277,779

(22) PCT Filed: Nov. 8, 2022

(86) PCT No.: PCT/CN2022/130594
§ 371 (c)(1),
(2) Date: Aug. 18, 2023

(87) PCT Pub. No.: WO2024/098247
PCT Pub. Date: May 16, 2024

(65) Prior Publication Data
US 2025/0017089 A1 Jan. 9, 2025

(51) Int. Cl.
H10K 59/80 (2023.01)
H10K 59/12 (2023.01)
(Continued)

(52) U.S. Cl.
CPC ..... H10K 59/8792 (2023.02); H10K 59/1201 (2023.02); H10K 59/1213 (2023.02);
(Continued)

(58) Field of Classification Search
CPC . H10K 59/8792; H10K 59/126; H10K 59/122
(Continued)

(56) References Cited

U.S. PATENT DOCUMENTS

2022/0199712 A1* 6/2022 Park ................... H10K 59/8792
2022/0367585 A1* 11/2022 Lee ...................... H10K 59/123
(Continued)

FOREIGN PATENT DOCUMENTS

CN 108897169 A 11/2018
CN 214226938 U 9/2021
(Continued)

*Primary Examiner* — Nduka E Ojeh

(57) ABSTRACT

A display panel includes a base substrate and a display structure layer disposed on the base substrate, wherein the display structure layer includes a plurality of sub-pixels. At least one sub-pixel includes: a pixel circuit and a light emitting element electrically connected with the pixel circuit. The light emitting element includes a first light emitting unit and a second light emitting unit. A light emitting region of the first light emitting unit and a light emitting region of the second light emitting unit are isolated from each other. The pixel circuit is configured to drive at least one of the first light emitting unit and the second light emitting unit to emit light in the anti-peep display mode.

18 Claims, 15 Drawing Sheets

(51) Int. Cl.
| | |
|---|---|
| *H10K 59/121* | (2023.01) |
| *H10K 59/122* | (2023.01) |
| *H10K 59/35* | (2023.01) |
| *H10K 59/38* | (2023.01) |

(52) U.S. Cl.
CPC ......... *H10K 59/122* (2023.02); *H10K 59/353* (2023.02); *H10K 59/38* (2023.02)

(58) Field of Classification Search
USPC .......................................................... 257/40
See application file for complete search history.

(56) References Cited

U.S. PATENT DOCUMENTS

| | | | |
|---|---|---|---|
| 2023/0096638 A1* | 3/2023 | Lou ...................... | H10K 59/122 |
| | | | 257/40 |
| 2023/0100284 A1* | 3/2023 | Yao ...................... | G09G 3/3233 |
| | | | 345/55 |
| 2023/0213824 A1 | 7/2023 | Yang et al. | |
| 2023/0341985 A1* | 10/2023 | Lee ...................... | G06F 3/0412 |
| 2024/0040829 A1* | 2/2024 | Fu ......................... | H10K 50/865 |
| 2024/0242664 A1* | 7/2024 | Yao .......................... | G09G 3/20 |

FOREIGN PATENT DOCUMENTS

| | | |
|---|---|---|
| CN | 114333609 A | 4/2022 |
| CN | 115241397 A | 10/2022 |

* cited by examiner

DISPLAY PANEL COMPRISING ANTI-PEEP DISPLAY MODE, MANUFACTURING METHOD THEREFOR, AND DISPLAY DEVICE

CROSS-REFERENCE TO RELATED APPLICATION

This application is a national: stage application of PCT Application No. PCT/CN2022/130594, which is filed on Nov. 8, 2022 and entitled "Display Panel, Manufacturing Method Therefor, and Display Device", the content of which should be regarded as being incorporated herein by reference.

TECHNICAL FIELD

The present disclosure relates, but is not limited, to the technical field of display, and particularly to a display panel, a manufacturing method thereof, and a display device.

BACKGROUND

With the continuous development of display technology, people's demand for display modes is becoming more and more diversified. In the use of some display applications, users like to share information with others. In the use of some other applications, users need to protect privacy and display products with anti-peep function, for example, users enter personal data on mobile phones, users process confidential company data, etc. Therefore, switching between display sharing and privacy has gradually become a functional trend of display products.

SUMMARY

The following is a summary of subject matter described herein in detail. The summary is not intended to limit the protection scope of claims.

Embodiments of the present disclosure provide a display substrate, a manufacturing method for the display panel, and a display device.

In an aspect, an embodiment of the present disclosure provides a display panel, including: a base substrate and a display structure layer disposed on the base substrate. The display structure layer includes a plurality of sub-pixels. At least one sub-pixel of the plurality of sub-pixels includes a pixel circuit and a light emitting element electrically connected with the pixel circuit. The light emitting element includes a first light emitting unit and a second light emitting unit; a light emitting region of the first light emitting unit and a light emitting region of the second light emitting unit are isolated from each other. The pixel circuit is configured to drive at least one of the first light emitting unit and the second light emitting unit to emit light in an anti-peep display mode.

In some exemplary embodiments, the pixel circuit is configured to drive only the first light emitting unit to emit light in the anti-peep display mode, and to drive the second light emitting unit along with the first light emitting unit to emit light in a sharing display mode.

In some exemplary embodiments, an area of the light emitting region of the first light emitting unit of the light emitting element is greater than or equal to an area of the light emitting region of the second light emitting unit.

In some exemplary embodiments, the display panel further includes: at least one shielding layer located on a light emitting side of the display structure layer, an orthographic projection of the shielding layer on the base substrate is not overlapped with orthographic projections of the light emitting regions of the first light emitting unit and the second light emitting unit of the light emitting element on the base substrate; the orthographic projection of the shielding layer on the base substrate surrounds the orthographic projection of the first light emitting unit of the light emitting element on the base substrate, or the orthographic projection of the shielding layer on the base substrate surrounds the orthographic projection of the light emitting element on the base substrate.

In some exemplary embodiments, the display panel further includes a color filter layer located on a side of the at least one shielding layer away from the base substrate, the color filter layer includes a plurality of filter units arranged periodically and a black matrix located between adjacent filter units, the plurality of filter units correspond to light emitting elements of the plurality of sub-pixels one by one.

In some exemplary embodiments, an orthographic projection of at least one of the plurality of filter units on the base substrate covers an orthographic projection of a light emitting element of a corresponding sub-pixel on the base substrate.

In some exemplary embodiments, the display panel further includes a light adjustment layer located on a side of the at least one shielding layer away from the base substrate, the light adjustment layer includes at least one lens unit, an orthographic projection of the at least one lens unit on the base substrate is at least partially overlapped with an orthographic projection of the light emitting region of the first light emitting unit of the light emitting element on the base substrate.

In some exemplary embodiments, the display panel further includes a first protective layer and a second protective layer located on a side of the at least one shielding layer away from the base substrate; the second protective layer is located on a side of the first protective layer close to the base substrate, a refractive index of the second protective layer is less than that of the first protective layer, an orthographic projection of the second protective layer on the base substrate is not overlapped with the light emitting region of the light emitting element, and an orthographic projection of the first protective layer on the base substrate covers the orthographic projection of the second protective layer on the base substrate.

In some exemplary embodiments, the display structure layer includes an anode layer including a first anode of the first light emitting unit of the light emitting element and a second anode of the second light emitting unit, both of the first anode and the second anode are electrically connected to the pixel circuit, the first anode and the second anode are isolated from each other; planes where the first anode and the second anode are located are flush, or the second anode is located on a side of the first anode away from the base substrate.

In some exemplary embodiments, the display structure layer includes an anode layer and a pixel definition layer located on a side of the anode layer away from the base substrate, the pixel definition layer is provided with a plurality of pixel openings exposing at least a portion of a surface of the anode layer, the pixel definition layer is black.

In some exemplary embodiments, a spacing between the first light emitting unit and the second light emitting unit of the light emitting element of the at least one sub-pixel is less than a spacing between the light emitting elements of adjacent sub-pixels emitting light of different colors.

In some exemplary embodiments, the light emitting elements of the plurality of sub-pixels are arranged in an array, the first light emitting unit and the second light emitting unit of the light emitting element of the sub-pixels emitting the same color light are alternately arranged along a first direction and alternately arranged along a second direction, the first direction intersects the second direction.

In some exemplary embodiments, the pixel circuit at least includes a data writing sub-circuit, a storage sub-circuit, a drive sub-circuit, and a control sub-circuit. The data writing sub-circuit is electrically connected to a data line, a first scan line, and the drive sub-circuit, and is configured to supply a data signal transmitted by the data line to the drive sub-circuit under the control of the first scan line. The drive sub-circuit is electrically connected with the data writing sub-circuit, the storage sub-circuit, the control sub-circuit and the first light emitting unit of the light emitting element, and is configured to drive the first light emitting unit to emit light under the control of the data signal. The control sub-circuit is electrically connected a second scan line, the drive sub-circuit, the first light emitting unit and the second light emitting unit of the light emitting element, and is configured to control the second light emitting unit along with the first light emitting unit to emit light under the control of the second scan line.

In some exemplary embodiments, the control sub-circuit includes: a first control transistor; a gate of the first control transistor is electrically connected with the second scan line, a first electrode of the first control transistor is electrically connected with the first light emitting unit, and a second electrode of the first control transistor is electrically connected with the second light emitting unit.

In some exemplary embodiments, the pixel circuit of the at least one sub-pixel is configured, in an anti-peep display mode, to drive only the second light emitting unit to emit light, or to drive the first light emitting unit and the second light emitting unit to emit light separately; in a sharing display mode, to drive the second light emitting unit along with the first light emitting unit to emit light.

In some exemplary embodiments, the display panel further includes a light blocking layer located on the light emitting side of the display structure layer, the light blocking layer includes at least one light blocking section, an orthographic projection of the light blocking section on the base substrate covers an orthographic projection of the light emitting region of the second light emitting unit on the base substrate.

In some exemplary embodiments, the plurality of sub-pixels include a first sub-pixel that emits a first color light, a second sub-pixel that emits a second color light, and a third sub-pixel that emits a third color light; in the anti-peep display mode, the second light emitting units of the light emitting elements of the first sub-pixel, the second sub-pixel and the third sub-pixel are all configured to emit light.

In some exemplary embodiments, the pixel circuit at least includes a data writing sub-circuit, a storage sub-circuit, a drive sub-circuit, and a control sub-circuit. The data writing sub-circuit is electrically connected to a data line, a first scan line, and the drive sub-circuit, and is configured to supply a data signal transmitted by the data line to the drive sub-circuit under the control of the first scan line. The drive sub-circuit is electrically connected with the data writing sub-circuit, the storage sub-circuit, the control sub-circuit and the first light emitting unit of the light emitting element, and is configured to drive the first light emitting unit to emit light under the control of the data signal. The control sub-circuit is electrically connected with a second scan line, a first power supply line, the drive sub-circuit, the first light emitting unit and the second light emitting unit of the light emitting element, and is configured to control the second light emitting unit along with the first light emitting unit to emit light under the control of the second scan line, or to drive the second light emitting unit to emit light.

In some exemplary embodiments the control sub-circuit includes a first control transistor and a second control transistor; a gate of the first control transistor is electrically connected with the second scan line, a first electrode of the first control transistor is electrically connected with the first light emitting unit, and a second electrode of the first control transistor is electrically connected with the second light emitting unit; a gate of the second control transistor is electrically connected with the second scan line, a first electrode of the second control transistor is electrically connected with the first power supply line, and a second electrode of the second control transistor is electrically connected with the second light emitting unit; the second control transistor and the first control transistor are different in transistor type.

In another aspect, an embodiment of the present disclosure provides a display device, which includes the aforementioned display panel.

In another aspect, an embodiment of the present disclosure provides a manufacturing method for a display panel, which is used for manufacturing the above-mentioned display panel. The manufacturing method includes: forming display structure layer on a base substrate, wherein the display structure layer includes a plurality of sub-pixels. At least one sub-pixel of the plurality of sub-pixels includes a pixel circuit and a light emitting element electrically connected with the pixel circuit, wherein the light emitting element includes a first light emitting unit and a second light emitting unit; a light emitting region of the first light emitting unit and a light emitting region of the second light emitting unit are isolated from each other. The pixel circuit is configured to drive at least one of the first light emitting unit and the second light emitting unit to emit light in an anti-peep display mode.

Other aspects may be understood upon reading and understanding the drawings and detailed description.

BRIEF DESCRIPTION OF DRAWINGS

Accompanying drawings are used to provide an understanding of technical solutions of the present disclosure, form a part of the specification, and are used to explain the technical solutions of the present disclosure together with the embodiments of the present disclosure but are not intended to form limitations on the technical solutions of the present disclosure. Shapes and sizes of one or more components in the drawings do not reflect actual scales, and are only intended to schematically describe contents of the present disclosure.

DETAILED DESCRIPTION

Figure 1:
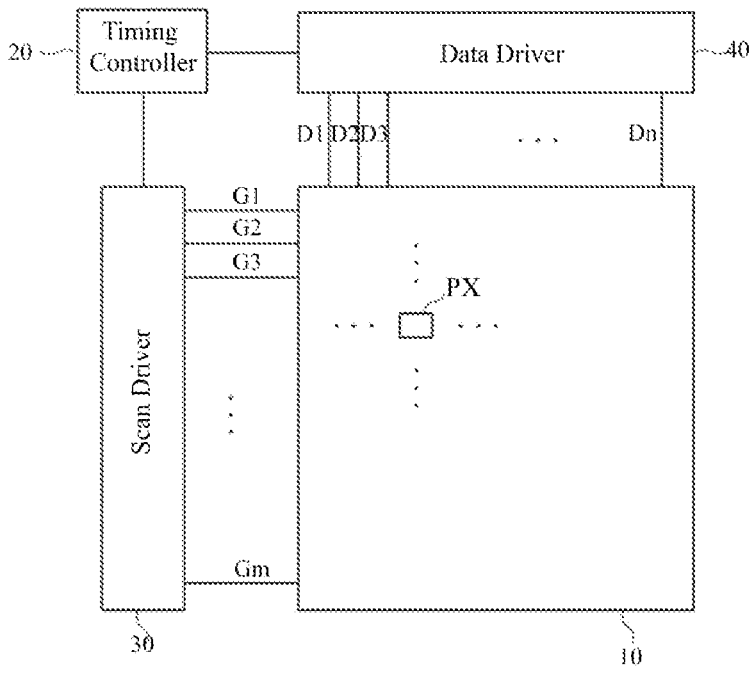
FIG. 1 is a schematic structural diagram of a display panel according to at least one embodiment of the present disclosure.

The embodiments of the present disclosure will be described below with reference to the drawings in detail. Implementations may be implemented in a plurality of different forms. Those of ordinary skills in the art may easily understand such a fact that implementations and contents may be transformed into one or more forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one implementation of the present disclosure is not necessarily limited to the sizes, and shapes and sizes of various components in the drawings do not reflect actual scales. In addition, the drawings schematically illustrate ideal examples, and one implementation of the present disclosure is not limited to shapes, numerical values, or the like shown in the drawings.

Ordinal numerals such as "first", "second", and "third" in the specification are set to avoid confusion between constituent elements, but not to set a limit in quantity. In the present disclosure, "a plurality of" may include two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements are changed as appropriate based on directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or an internal communication between two elements. Those of ordinary skills in the art may understand meanings of the above-mentioned terms in the present disclosure according to situations.

In the specification, "electrical connection" includes a case that constituent elements are connected together through an element with a certain electrical effect. The "element with the certain electrical effect" is not particularly limited as long as electrical signals between the connected constituent elements may be transmitted. Examples of the "element with the certain electrical effect" not only include electrodes and wirings, but also include switching elements such as transistors, resistors, inductors, capacitors, other elements with one or more functions, etc.

In the specification, a transistor refers to an element which at least includes three terminals, i.e., a gate electrode (gate), a drain electrode and a source electrode. The transistor has a channel region between the drain electrode (drain electrode terminal, drain area, or drain) and the source electrode (source electrode terminal, source area, or source), and a current can flow through the drain electrode, the channel region and the source electrode. In the present disclosure, the channel region refers to an area which the current flows mainly through.

In this specification, for distinguishing the two electrodes, except the gate, of the transistor, one electrode is called a first electrode, and the other electrode is called a second electrode. The first electrode may be the source or the drain, and the second electrode may be the drain or the source. In addition, a gate of the transistor may be called a control electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "about" and "substantially" refer to that a boundary is not defined strictly and a case within a process and measurement error range is allowed. In this specification, "substantially the same" could be a case where values differ by less than 10%.

In order to realize the anti-peep function of display products, there are many solutions at present. For example, an external anti-peeping film is adopted, and the anti-peeping function is realized by manually hanging the anti-peeping film in front of the display screen, and the anti-peeping film can be manually removed when not needed; for another example, a liquid crystal layer is added in front of the display screen, and a light emitting angle is limited by the turning of liquid crystal molecules to realize the anti-peeping function. However, these solutions easily lead to complex structure of the display panel and increase the thickness of the display panel, which is not conducive to improving the user experience.

The present embodiment provides a display panel, which includes a base substrate and a display structure layer disposed on the base substrate. The display structure layer includes a plurality of sub-pixels. At least one sub-pixel includes: a pixel circuit and a light emitting element electrically connected with the pixel circuit. The light emitting element includes a first light emitting unit and a second light emitting unit. A light emitting region of the first light emitting unit and a light emitting region of the second light emitting unit are isolated from each other. The pixel circuit is configured to drive at least one of the first light emitting unit and the second light emitting unit to emit light in an anti-peep display mode.

The display panel provided in the present embodiment realizes the anti-peep effect by dividing a light emitting element of a sub-pixel into two light emitting units (i.e., a first light emitting unit and a second light emitting unit), and performing light emitting control on the first light emitting unit and the second light emitting unit through a pixel circuit. By improving the internal structure of the display panel, the display panel provided by the embodiment can realize the anti-peep display effect without increasing the thickness of the display panel, thereby improving the user experience.

In some exemplary embodiments, the display panel may be an Organic Light Emitting Diode (OLED) display panel, or a Quantum Dot Light Emitting Diodes (QLED) display panel, or a plasma display device (PDP) display panel, or an electrophoretic display (EPD) display panel. This embodiment is not limited thereto.

In some exemplary embodiments, the display panel may include an anti-peep display mode and a sharing display mode. The anti-peep display mode can meet the display requirements of users for privacy protection, and the sharing display mode can meet the display requirements of users for information sharing scenarios. In some examples, the display panel may be provided with a switching button by which the user switches the display mode of the display panel. However, this embodiment is not limited thereto. In other examples, acoustic control, induction and other triggering methods can be used to start the display mode switching of the display panel.

In some exemplary embodiments, the pixel circuit may be configured to drive only the first light emitting unit to emit light in the anti-peep display mode, and to drive the second light emitting unit along with the first light emitting unit to emit light in a sharing display mode. In some other examples, the pixel circuit may be configured, in the anti-peep display mode, to drive only the second light emitting unit to emit light, or to drive the first light emitting unit and the second light emitting unit to emit light separately, and in the sharing display mode, to drive the second light emitting unit along with the first light emitting unit to emit light. However, this embodiment is not limited thereto. In this example, by improving the internal structure of the display panel, the anti-peep display effect and sharing display effect can be realized without increasing the thickness of the display panel, thus improving the user experience.

In some exemplary embodiments, the display panel may include at least one shielding layer located on the light emitting side of the display structure layer, an orthographic projection of the shielding layer on the base substrate may be not overlapped with an orthographic projection of the light emitting regions of the first light emitting unit and the second light emitting unit of the light emitting element on the base substrate. The orthographic projection of the shielding layer on the base substrate may surround the orthographic projection of the first light emitting unit of the light emitting element on the base substrate, or the orthographic projection of the shielding layer on the base substrate may surround the orthographic projection of the light emitting element on the base substrate. In some examples, the number of shielding layers may be two, and a protective layer may be provided between adjacent shielding layers. By arranging at least one shielding layer around the light emitting element or the first light emitting unit of the light emitting element, a light emitting angle of the first light emitting unit of the light emitting element may be limited, thereby facilitating the realization of the anti-peep display effect.

In some exemplary embodiments, the display panel may further include a color filter layer located on a side of the at least one shielding layer away from the base substrate. The color filter layer may include a plurality of filter units arranged periodically and a black matrix positioned between adjacent filter units, the plurality of filter units correspond to light emitting elements of the plurality of sub-pixels one by one. In this example, by providing a color filter layer, a light emitting angle of the light emitting element may be limited by using the black matrix and the filter units, thus facilitating the realization of the anti-peep display effect.

Solutions of the embodiments will be described below through some examples.

FIG. 1 is a schematic diagram of a structure of a display panel according to at least one embodiment of the present disclosure. In some exemplary embodiments, as shown in FIG. 1, the display panel may include a timing controller 20, a data driver 40, a gate drive circuit, and a sub-pixel array 10. The gate drive circuit may include at least one driver, such as a scan driver 30. The timing controller 20, the data driver 40 and the gate drive circuit may be located in a peripheral area outside a display area of the display panel. The sub-pixel array 10 located in the display area may include a plurality of sub-pixels PX arranged regularly. The scan driver 30 may be configured to supply a scan signal to the sub-pixel PX along the scan line; the data driver 40 may be configured to provide a data signal to the sub-pixels PX along the data line; the timing controller 20 may be configured to control the scan driver 30 and the data driver 40.

In some examples, the timing controller 20 may provide a gray-scale value and control signal suitable for a specification of the data driver 40 for the data driver 40. The timing controller 20 may provide a clock signal, initial signal, etc., suitable for a specification of the scan driver 30 for the scan driver 30. The data driver 40 may generate a data voltage, which will be provided to data lines D1 to Dn, using the gray-scale value and the control signal received from the timing controller 20. For example, the data driver 40 may sample the gray-scale value using a clock signal and apply a data signal corresponding to the gray-scale value on the data lines D1 to Dn by taking a row of sub-pixels as a unit. The scan driver 30 may generate a scan signal, which will be provided to scan lines G1 to Sm, through the clock signal and the initial signal received from the timing controller 20. For example, the scan driver 30 may sequentially provide a scan signal with a turn-on level pulse to a scan line. In some examples, the scan driver 30 may include a shift register and may generate a scan signal by sequentially transmitting a scan initial signal provided in a form of a turn-on level pulse to a next-stage circuit under control of a clock signal. Herein, n and m are both natural numbers.

In some exemplary embodiments, the gate drive circuit may be directly disposed on the base substrate. For example, the gate driver may be disposed in the peripheral area on the left and right sides of the display area. In some examples, the gate driver may be formed together with a sub-pixel in a process of forming the sub-pixel. However, positions of the gate driver or a manner in which the gate driver is formed are not limited in this embodiment. In some examples, the gate driver may be disposed on a separate chip or printed circuit board so as to be connected with a bonding pad or welding gasket formed on the base substrate.

In some examples, the data driver 40 may be disposed on an independent chip or printed circuit board to be connected with the sub-pixel through the signal access pin provided by the base substrate. For example, the data driver 40 may be formed and disposed using a chip on glass, a chip on plastic, a chip on film, etc., so as to be connected with the signal access pin on the base substrate. The timing controller 20 may be provided separately from the data driver 40 or provided integrally with the data driver 40. However, this embodiment is not limited thereto.

Figure 2:
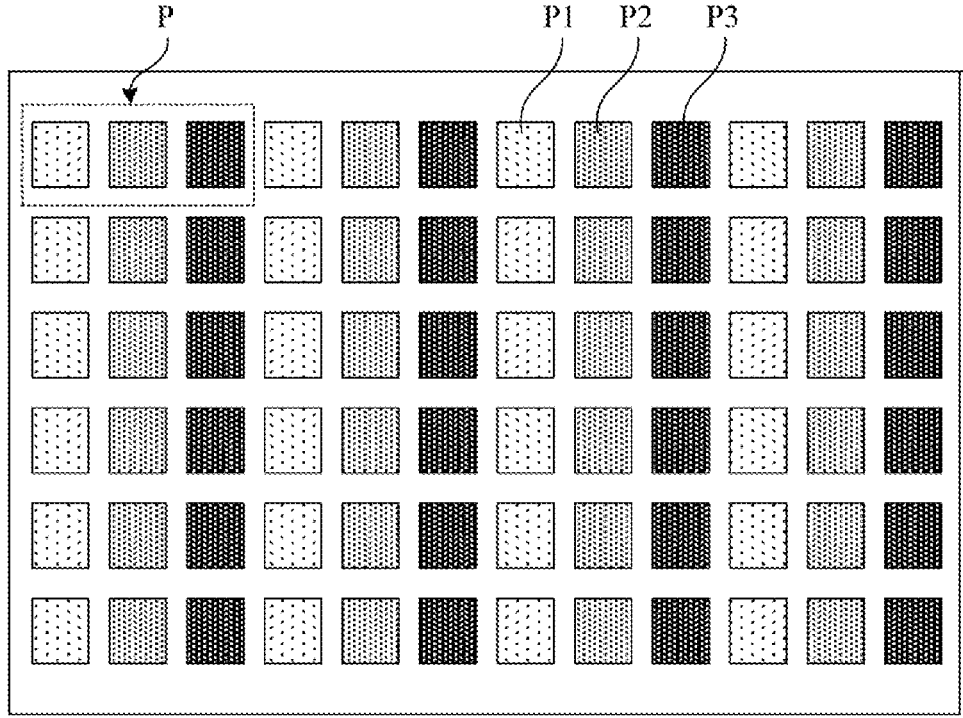
FIG. 2 is a schematic plane structural diagram of a display panel according to at least one embodiment of the present disclosure.

FIG. 2 is a schematic plane structural diagram of the display panel according to at least one embodiment of the present disclosure. In some examples, as shown in FIG. 2, the display area of the display panel may include a plurality of pixel units P arranged in a matrix, wherein at least one of the plurality of pixel units P may include a first sub-pixel P1 that emits first color light, a second sub-pixel P2 that emits second color light, and a third sub-pixel P3 that emits third color light. For example, the first color light may be red light, the second color light may be green light, and the third color light may be blue light. In other words, the first sub-pixel P1 may be a red (R) sub-pixel, the second sub-pixel P2 may be a green (G) sub-pixel, and the third sub-pixel P3 may be a blue (B) sub-pixel. In some examples, the pixel unit P may include four sub-pixels, for example, including a red sub-pixel, a green sub-pixel, a blue sub-pixel, and a white sub-pixel. However, the present disclosure is not limited thereto.

In some examples, the shape of the sub-pixel in the pixel unit P may be a rectangle, a rhombus, a pentagon, or a hexagon. As shown in FIG. 2 the shape of the sub-pixels in the pixel unit P may be a rectangle. For example, when pixel unit P includes three sub-pixels, the three sub-pixels may be arranged side by side horizontally, side by side vertically, or in a triangle arrangement; when the pixel unit P includes four sub-pixels, the four sub-pixels may be arranged side by side horizontally, side by side vertically, or in a square arrangement. However, the present disclosure is not limited thereto.

In some examples, at least one sub-pixel may include a pixel circuit and a light emitting element. For example, each of the first sub-pixel P1, the second sub-pixel P2, and the third sub-pixel P3 may include a pixel circuit and a light emitting element. In some examples, the pixel circuit may include a plurality of transistors and at least one capacitor. For example, the pixel circuit may be a 3T1C structure, a 7T1C structure, a 5T1C structure, an 8T1C structure, or an 8T2C structure, etc., wherein T in the above circuit structure refers to a thin film transistor, C refers to a capacitor, the number in front of T represents the number of thin film transistors in the circuit, and the number in front of C represents the number of capacitors in the circuit.

In some examples, the light emitting elements in the first sub-pixel P1, the second sub-pixel P2, and the third sub-pixel P3 are respectively connected to the pixel circuits of the sub-pixel where the light emitting elements are located, and the light emitting elements may be configured to emit light of corresponding brightness in response to a driving current output by the pixel circuit of the sub-pixel where the light emitting elements are located. For example, the light emitting element may be an organic light emitting diode (OLED) and may include a first electrode (anode) an organic light emitting layer and a second electrode (cathode) that are stacked. However, this embodiment is not limited thereto. For example, the light emitting element may be a Micro Light Emitting Diode (Micro-LED), a Mini-LED, or a Quantum Dot Light Emitting Diode (QLED).

Figures 3, 4:
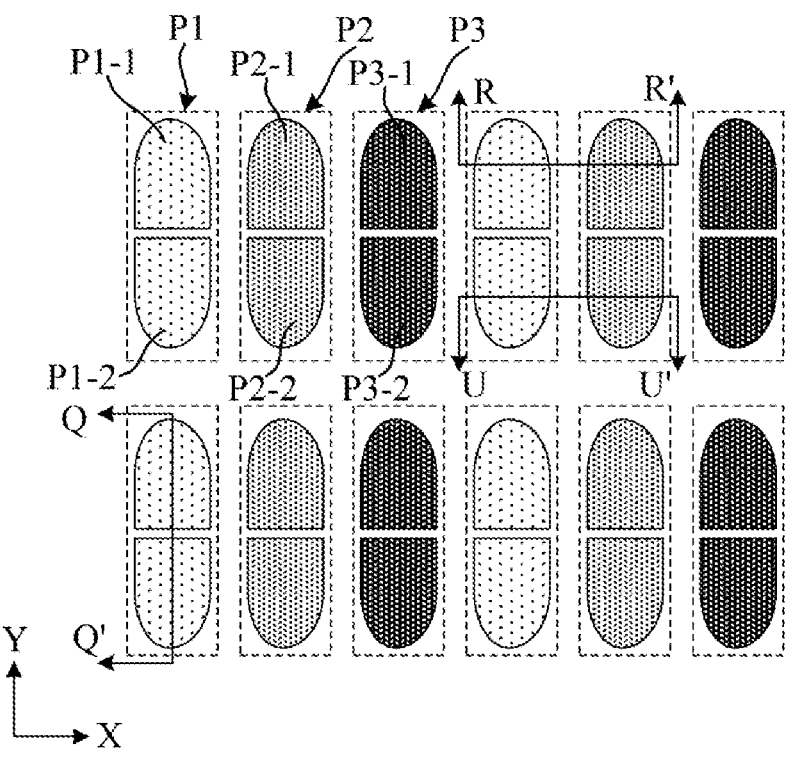
FIG. 3 is a schematic plane view of a sub-pixel of a display panel according to at least one embodiment of the present disclosure.
FIG. 4 is a schematic diagram of a pixel circuit according to at least one embodiment of the present disclosure.

FIG. 3 is a schematic plane view of a sub-pixel of a display panel according to at least one embodiment of the present disclosure. In some examples, as shown in FIG. 3, a plurality of sub-pixels within the display area of the display panel may be arranged in an array, for example, sequentially arranged along the first direction X and sequentially arranged along the second direction Y. The first direction X and the second direction Y are located in a same plane and intersect with the each other, for example, the first direction X is perpendicular to the second direction Y. In this example, a plurality of sub-pixels arranged along the first direction X may be referred to as one row of sub-pixels, and a plurality of sub-pixels arranged along the second direction Y may be referred to as one column of sub-pixels. Within one row of sub-pixels, the first sub-pixel P1, the second sub-pixel P2, and the third sub-pixel P3 may be arranged periodically; a plurality of sub-pixels emitting the same color light can be arranged in a column of sub-pixels. For example, a plurality of first sub-pixels P1 may be arranged in one column, a plurality of second sub-pixels P2 may be arranged in another column, and a plurality of third sub-pixels P3 may be arranged in another column.

In some examples, as shown in FIG. 3, the light emitting element of at least one sub-pixel may be divided into two light emitting units along the second direction Y. For example, the light emitting element of the first sub-pixel P1 may include a first light emitting unit P1-1 and a second light emitting unit P1-2 arranged along the second direction Y; the light emitting element of the second sub-pixel P2 may include a first light emitting unit P2-1 and a second light emitting unit P2-2 arranged along the second direction Y; the light emitting element of the third sub-pixel P3 may include a first light emitting unit P3-1 and a second light emitting unit P3-2 arranged along the second direction Y. In the first direction X, the first light emitting units P1-1, P2-1, and P3-1 may be sequentially arranged into a row, and the second light emitting units P1-2, P2-2, and P3-2 may be sequentially arranged into a row. In the second direction Y, the first light emitting unit P1-1 and the second light emitting unit P1-2 may be arranged at intervals, the first light emitting unit P2-1 and the second light emitting unit P2-2 may be arranged at intervals, and the first light emitting unit P3-1 and the second light emitting unit P3-2 may be arranged at intervals.

In some examples, the light emitting region of the at least one light emitting element may include the light emitting region of the first light emitting unit and the light emitting region of the second light emitting unit of the light emitting element. The light emitting region of the first light emitting unit and the light emitting region of the second light emitting unit of the at least one light emitting element may be isolated from each other. An area of the light emitting region of the first light emitting unit of the at least one light emitting element may be substantially the same as an area of the light emitting region of the second light emitting unit. The shape of the first light emitting unit and the shape of the second light emitting unit of the at least one light emitting element may be substantially the same. However, this embodiment is not limited thereto. For example, the shapes of the two light emitting units of the at least one light emitting element may be different; for another example, the areas of the light emitting regions of the two light emitting units of the at least one light emitting element may be different, for example, the area of the light emitting region of the first light emitting unit may be larger than the area of the light emitting region of the second light emitting unit.

FIG. 4 is a schematic diagram of a pixel circuit according to at least one embodiment of the present disclosure. In some examples, as shown in FIG. 4, the pixel circuit may at least include a drive sub-circuit 11, a data writing sub-circuit 12, a storage sub-circuit 13 and a control sub-circuit 14. The data writing sub-circuit 12 may be electrically connected to a first scan line GL1, a data line DL, and a drive sub-circuit 11, and is configured to supply a data signal transmitted by the data line DL to the drive sub-circuit 11 under the control of the first scan line GL1. The drive sub-circuit 11 may be electrically connected to the storage sub-circuit 13, the data writing sub-circuit 12, the control sub-circuit 14 and the first light emitting unit EL1, and is configured to drive the first light emitting unit EL1 to emit light. The storage sub-circuit 13 may be electrically connected to the drive sub-circuit 11 and the first power supply line VDD. The control sub-circuit 14 may be electrically connected to a second scan line GL2, the drive sub-circuit 11, the first light emitting unit EL1 and the second light emitting unit EL2, and is configured to control the second light emitting unit EL2 along with the first light emitting unit EL1 to emit light under the control of the second scan line GL2.

In some examples, the first light emitting unit EL1 may include a first anode, a first organic light emitting layer and a first cathode that are stacked. The second light emitting unit EL2 may include a second anode, a second organic light emitting layer and a second cathode that are stacked. The first anode of the first light emitting unit EL1 may be electrically connected to the drive sub-circuit 11 and the control sub-circuit 14, and the first cathode of the first light emitting unit EL1 may be electrically connected to the second power supply line VSS. The second anode of the second light emitting unit EL2 may be electrically connected to the control sub-circuit 14, and the second cathode of the second light emitting unit EL2 may be electrically connected to the second power supply line VSS.

In some examples, the first power supply line VDD may be configured to continuously provide a first voltage signal of a high potential, and the second power supply line VSS may be configured to continuously provide a second voltage signal of a low potential. The first voltage signal is greater than the second voltage signal.

In some examples, the gate drive circuit disposed in the peripheral area of the display panel may include a first scan driver and a second scan driver. The first scan driver may be configured to provide a first scan signal to the first scan line, and the second scan driver may be configured to provide a second scan signal to the second scan line.

For example, the plurality of transistors of the pixel circuit may be low temperature polysilicon thin film transistors, or may be oxide thin film transistors, or may be low temperature polysilicon thin film transistors and oxide thin film transistors. The active layer of the low temperature polysilicon thin film transistor is made of Low Temperature Poly-Silicon (LTPS), and the active layer of the oxide thin film transistor is made of an oxide (Oxide). The low temperature polysilicon thin film transistor has advantages of a high mobility rate, fast charging, and the like, and the oxide thin film transistor has advantages of a low leakage current and the like. In some examples, the low temperature polysilicon thin film transistors and the oxide thin film transistors may be integrated on one display panel to form a low temperature polycrystalline oxide display panel. Advantages of the low temperature poly-silicon thin film transistor and the oxide thin film transistor may be used to achieve high Pixel Per Inch (PPI) and low frequency driving, so that power consumption may be reduced, and display quality may be improved. However, this embodiment is not limited thereto.

Figure 5:
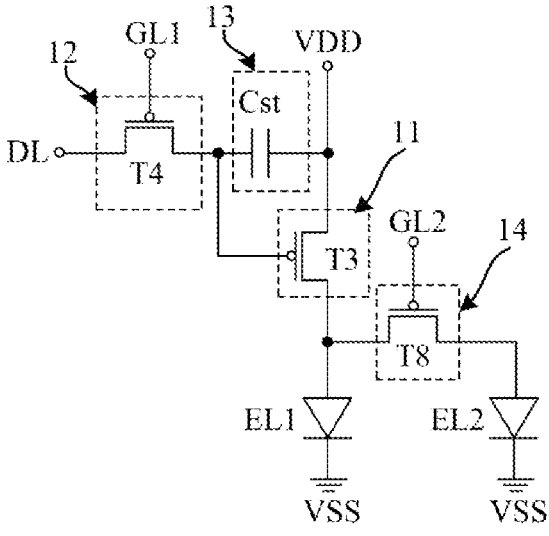
FIG. 5 is an equivalent circuit diagram of a pixel circuit according to at least one embodiment of the present disclosure.

FIG. 5 is an equivalent circuit diagram of a pixel circuit according to at least one embodiment of the present disclosure. In some examples, as shown in FIG. 5, the pixel circuit may be of a 3T1C structure. The drive sub-circuit 11 may include a drive transistor T3, the data writing sub-circuit 12 may include a data writing transistor T4, the storage sub-circuit 13 may include a storage capacitor Cst, and the control sub-circuit 14 may include a first control transistor T8.

In some examples, as shown in FIG. 5, a gate of the data writing transistor T4 is electrically connected to the first scan line GL1, a first electrode of the data writing transistor T4 is electrically connected to the data line DL, and a second electrode of the data writing transistor T4 is electrically connected to a first electrode plate of the storage capacitor Cst. A second electrode plate of the storage capacitor Cst is electrically connected to the first power supply line VDD. A gate of the drive transistor T3 is electrically connected to the first electrode plate of the storage capacitor Cst, a first electrode of the drive transistor T3 is electrically connected to the first power supply line VDD, and a second electrode of the drive transistor T3 is electrically connected to the first anode of the first light emitting unit EL1. A gate of the first control transistor T8 is electrically connected to the second scan line GL2, a first electrode of the first control transistor T8 is electrically connected to the first anode of the first light emitting unit EL1, and a second electrode of the first control transistor T8 is electrically connected to the second anode of the second light emitting unit EL2.

In some examples, as shown in FIG. 5, taking the drive transistor T3, the data writing transistor T4, and the first control transistor T8 being P-type transistors as an example, when the first scan signal provided by the first scan line GL1 is a low level signal, the data writing transistor T4 is turned on, the storage capacitor Cst is charged, and the data signal transmitted by the data line DL is stored in the storage capacitor Cst, and the data signal stored in the storage capacitor Cst can control a conduction degree of the drive transistor T3 to drive the first light emitting unit EL1 to emit light. When the second scan signal provided by the second scan line GL2 is a high level signal, the first control transistor T8 is turned off and the second light emitting unit EL2 does not emit light; when the second scan signal provided by the second scan line GL2 is a low level signal, the first control transistor T8 is turned on, and the second light emitting unit EL2 can emit light along with the first light emitting unit EL1.

In some examples, as shown in FIG. 5, in the anti-peep display mode, the second scan signal provided by the second scan line GL2 may continue to be a high level signal so that the first control transistor T8 is turned off, and the drive transistor T3 may drive only the first light emitting unit EL1 to emit light under the control of the data signal. In the sharing display mode, the second scan signal provided by the second scan line GL2 may be a low level signal, and the first control transistor T8 is turned on so that the drive transistor T3 can simultaneously drive the first light emitting unit EL1 and the second light emitting unit EL2 to emit light under the control of the data signal.

Figure 6:
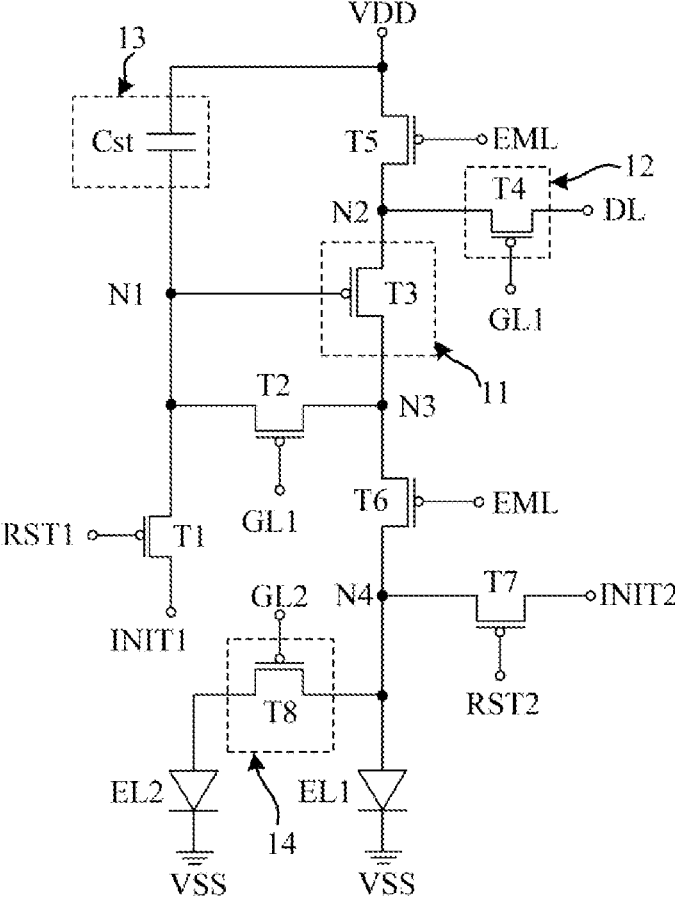
FIG. 6 is another equivalent circuit diagram of a pixel circuit according to at least one embodiment of the present disclosure.

FIG. 6 is another equivalent circuit diagram of a pixel circuit according to at least one embodiment of the present disclosure. In some examples, as shown in FIG. 6, the pixel circuit may be of an 8T1C structure. The drive sub-circuit 11 may include a drive transistor T3, the data writing sub-circuit 12 may include a data writing transistor T4, the storage sub-circuit 13 may include a storage capacitor Cst, and the control sub-circuit 14 may include a first control transistor T8. The pixel circuit may further include a first reset transistor T1, a second reset transistor T7, a threshold compensation transistor T2, a first light emitting control transistor T5, and a second light emitting control transistor T6.

In some examples, as shown in FIG. 6, a gate of the first reset transistor T1 is electrically connected to a first reset control line RST1, a first electrode of the first reset transistor T1 is electrically connected to a first initial signal line INIT1, and a second electrode of the first reset transistor T1 is electrically connected to a first node N1. A gate of the threshold compensation transistor T2 is electrically connected to the first scan line GL1, a first electrode of the threshold compensation transistor T2 is electrically connected to the first node N1, and a second electrode of the threshold compensation transistor T2 is electrically connected to a third node N3 A gate of the drive transistor T3 is electrically connected with the first node N1, a first electrode of the drive transistor T3 is electrically connected with a second node N2, and a second electrode of the drive transistor T3 is electrically connected with the third node N3. A gate of the data writing transistor T4 is electrically connected with the first scan line GL1, a first electrode of the data writing transistor T4 is electrically connected with the data line DL, and a second electrode of the data writing transistor T4 is electrically connected with the second node N2. A gate of the first light emitting control transistor T5 is electrically connected with a light emitting control line EML, a first electrode of the first light emitting control transistor T5 is electrically connected with the first power supply line VDD, and a second electrode of the first light emitting control transistor T5 is electrically connected with the second node N2. A gate of the second light emitting control transistor T6 is electrically connected with the light emitting control terminal EML, a first electrode of the second light emitting control transistor T6 is electrically connected with the third node N3, and a second electrode of the second light emitting control transistor T6 is electrically connected with a fourth node N4. A gate of the second reset transistor T7 is electrically connected to a second reset control line RST2, a first electrode of the second reset transistor T7 is electrically connected to the second initial signal line INIT2, and a second electrode of the second reset transistor T7 is electrically connected to the fourth node N4. A gate of the first control transistor T8 is electrically connected to the second scan line GL2, a first electrode of the first control transistor T8 is electrically connected to the fourth node N4, and a second electrode of the first control transistor T8 is electrically connected to the second anode of the second light emitting unit EL2. A first electrode plate of the storage capacitor Cst is electrically connected to the first node N1, and a second electrode plate of the storage capacitor Cst is electrically connected to the first power supply line VDD. The first anode of the first light emitting unit EL1 is electrically connected to the fourth node N4, and the first cathode of the first light emitting unit EL1 is electrically connected to the second power supply line VSS. The first anode of the second light emitting unit EL2 is electrically connected to a second electrode of the first control transistor T8, and the second cathode of the second light emitting unit EL2 is electrically connected to the second power supply line VSS.

In some examples, the first node N1 is a connection point of the first reset transistor T1, the threshold compensation transistor T2, the drive transistor T3 and the storage capacitor Cst. The second node N2 is a connection point of the drive transistor T3, the data writing transistor T4 and the first light emitting control transistor T5. The third node N3 is a connection point of the drive transistor T3, the threshold compensation transistor T2 and the second light emitting control transistor T6. The fourth node N4 is a connection point of the second light emitting control transistor T6, the second reset transistor T7, the first control transistor T8 and the first anode of the first light emitting unit EL1.

In some examples, illustration is made by taking an example in which eight transistors of the pixel circuit are all P-type transistors. The second reset control line RST2 may be connected to the first scan line GL1 to be inputted with a first scan signal. In the anti-peep display mode, the second scan line GL2 may continuously supply a second scan signal of a high level so that the first control transistor T8 is turned off and the second light emitting unit EL2 is in a non-light emitting state. In the sharing display mode, the second scan line GL2 may continuously supply a second scan signal of a low level so that the first control transistor T8 is turned on, and the second light emitting unit EL2 may emit light along with the first light emitting unit EL1.

In some examples, the first control transistor T8 is turned off in the anti-peep display mode. For example, the working process of the pixel circuit may include:

In the first stage, which is referred to as a reset stage, a first reset control signal provided by the first reset control line RST1 is a low-level signal, so that the first reset transistor T1 is turned on, and a first initial signal provided by the first initial signal line INIT1 may be provided to the first node N1 to initialize the first node N1 and clear an original data voltage in the storage capacitor Cst. The first scan signal provided by the first scan line GL1 is a high-level signal, and the light emitting control signal provided by the light emitting control line EML is a high-level signal, so that the data writing transistor T4, the threshold compensation transistor T2, the first light emitting control transistor T5, the second light emitting control transistor T6, and the second reset transistor T7 are turned off. At this stage, the first light emitting unit EL1 does not emit light.

The second stage is referred to as a data writing stage or a threshold compensation stage. The first scan signal provided by the first scan line GL1 is a low-level signal, the first reset control signal provided by the first reset control line RST1 and the light emitting control signal EM provided by the light emitting control line EML are both high-level signals, and the data line DL outputs the data signal. In this phase, the first electrode plate of the storage capacitor Cst is at a low-level, such that the drive transistor T3 is turned on. The first scan signal is the low-level signal, so that the threshold compensation transistor T2, the data writing transistor T4, and the second reset transistor T7 are turned on. The threshold compensation transistor T2 and the data writing transistor T4 are turned on, so that the data voltage output by the data line DL is provided to the first node N1 through the second node N2, the turned-on drive transistor T3, the third node N3, and the turned-on threshold compensation transistor T2, and charge the difference between the data voltage output by the data line DL and the threshold voltage of the drive transistor T3 into the storage capacitor Cst. The voltage of the first electrode plate of the storage capacitor Cst (that is, the first node N1) is Vdata−|Vth|, where Vdata is the data voltage output from the data line DL, and Vth is the threshold voltage of the drive transistor T3. The second reset transistor T7 is turned on so that the second initial signal provided by the second initial signal line INIT2 is supplied to the fourth node N4, and the fourth node N4 is initialized to ensure that the first light emitting unit EL1 does not emit light. The first reset control signal provided by the first reset control line RST1 is a high-level signal, so that the first reset transistor T1 is turned off. The light emitting control signal provided by the light emitting control signal line EML is a high-level signal, so that the first light emitting control transistor T5 and the second light emitting control transistor T6 are turned off.

The third stage is referred to as a light emitting stage. A light emitting control signal provided by the light emitting control signal line EML is a low-level signal, and the first scan signal provided by the first scan line GL1 and the first reset control signal provided by the first reset control line RST1 are high-level signals. The light emitting control signal provided by the light emitting control signal line EML is a low-level signal, so that the first light emitting control transistor T5 and the second emitting control transistor T6 are turned on, and a first voltage signal output by the first power supply line VDD provides a drive voltage to the first anode of the light emitting unit EL1 through the turned-on first light emitting control transistor T5, the drive transistor T3, and the second light emitting control transistor T6 to drive the first light emitting unit EL1 to emit light.

In a drive process of the pixel circuit, a drive current flowing through the drive transistor T3 is determined by a voltage difference between the gate and the first electrode of the drive transistor T3. Since the voltage of the first node N1 is Vdata−|Vth|, the drive current of the drive transistor T3 is as follows.

$$I = K \times (Vgs - Vth)^2 =$$
$$K \times [(Vdd - Vdata + |Vth|) - Vth]^2 = K \times [(Vdd - Vdata)]^2;$$

where, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL, and Vdd is the first power supply signal output from the first power supply line VDD.

It can be seen from the above formula that the driving current is independent of the threshold voltage of the drive transistor T3. Therefore, the pixel circuit of this embodiment may better compensate the threshold voltage of the drive transistor T3.

The above pixel circuit is only an example. However, a structure of a pixel circuit is not limited in the present embodiment.

In this example, in the anti-peep display mode, the first light emitting unit EL1 of the light emitting element of the sub-pixel is illuminated and the second light emitting unit EL2 is not illuminated, and a light emitting area and a light emitting angle of the sub-pixel can be limited; in the sharing display mode, the first light emitting unit EL1 and the second light emitting unit EL2 of the light emitting element of the sub-pixel can be illuminated at the same time, and the light emitting area and the light emitting angle of the sub-pixel can be increased. This example can switch between anti-peep effect and sharing effect.

Figure 7:
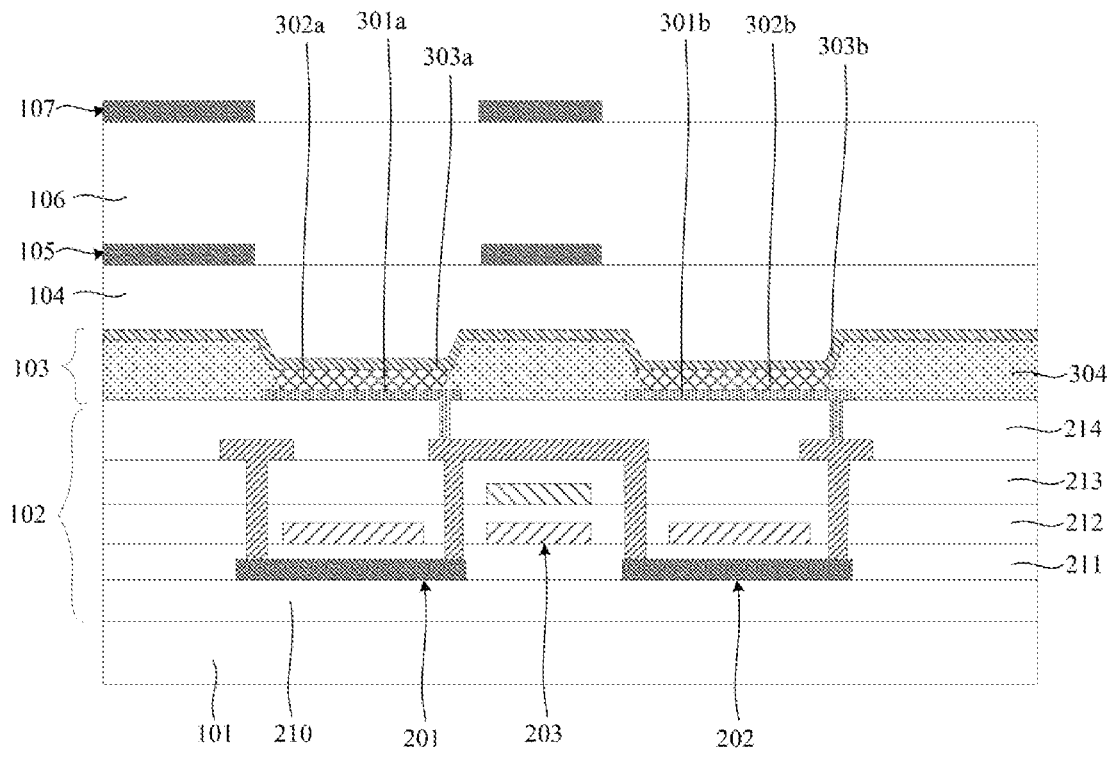
FIG. 7 is a partial cross-sectional schematic diagram taken along Q-Q' direction in FIG. 3.

FIG. 7 is a partial cross-sectional schematic view taken along Q-Q' direction in FIG. 3. FIG. 7 illustrates a partial cross-sectional structure of one first sub-pixel P1. In some examples, as shown in FIG. 7, in a direction perpendicular to the display panel, the display panel may include a base substrate 101, and a display structure layer, an encapsulation structure layer 104, a first shielding layer 105, a first protective layer 106 and a second shielding layer 107 sequentially disposed on the base substrate 101. The display structure layer includes a circuit structure layer 102 and a light emitting structure layer 103 which are sequentially disposed on the base substrate 101. In some possible implementations, the display panel may include other film layers, such as post spacers, which are not limited here in the present disclosure.

Hereinafter, an exemplary description will be given through a manufacturing process of a display panel with reference to FIG. 7. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. A "thin film" refers to a layer of thin film made of a material on a base substrate using deposition, coating, or other processes. If the "film" does not need to be processed through a patterning process in the entire manufacturing process, the "film" may also be called a "layer". If the "film" needs to be processed through the patterning process in the entire manufacturing process, the "film" is called a "film" before the patterning process is performed and is called a "layer" after the patterning process is performed. At least one "pattern" is contained in the "layer" which has been processed through the patterning process. In the exemplary embodiment of the present disclosure, "an orthographic projection of B being within the range of an orthographic projection of A" or "an orthographic projection of A containing an orthographic projection of B" means that the boundary of the orthographic projection of B falls within the range of the boundary of the orthographic projection of A, or the boundary of the orthographic projection of A is overlapped with the boundary of the orthographic projection of B.

In some examples, a manufacturing process of a display panel may include following operations.

(1) A base substrate 101 is provided. In some examples, the base substrate 101 may be a flexible base substrate or may be a rigid base substrate. For example, the rigid base substrate may include a glass substrate. The flexible base substrate may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET) or a polymer soft film with surface treatment. Materials of the first inorganic material layer and the second inorganic material layer may be silicon nitride (SiNx) or silicon oxide (SiOx), for improving water and oxygen resistance of the base substrate, and a material of the semiconductor layer may be amorphous silicon (a-si). However, this embodiment is not limited thereto.

(2) A circuit structure layer 102 is formed. In some examples, the circuit structure layer 102 may include transistors and storage capacitors of a plurality of pixel circuits. FIG. 7 illustrates a structure of two transistors (e.g. a first transistor 201 and a second transistor 202) and one storage capacitor 203 of one pixel circuit as an example. For example, the first transistor 201 may be the drive transistor T3, the second reset transistor T7 or the second light emitting control transistor T6 in the aforementioned pixel circuit, the second transistor 202 may be the first control transistor T8 in the aforementioned pixel circuit, and the storage capacitor 203 may be the storage capacitor Cst in the aforementioned pixel circuit.

In some examples, as shown in FIG. 7, the circuit structure layer 102 may include a buffer layer 210, a semiconductor layer, a first insulation layer 211, a first gate metal layer, a second insulation layer 212, a second gate metal layer, a third insulation layer 213, a first source-drain metal layer, and a fourth insulation layer 214 that are sequentially disposed on the base substrate 101.

In some examples, as shown in FIG. 7, a buffer thin film and a semiconductor thin film are sequentially deposited on the base substrate 101 where the aforementioned structures are formed, and the semiconductor thin film is patterned by a patterning process to form a buffer layer 210 and a semiconductor layer disposed on the buffer layer 210. For example, the semiconductor layer may at least include an active layer of the first transistor 201 and an active layer of the second transistor 202.

Subsequently, a first insulation thin film and a first conductive film are sequentially deposited on the base substrate 101 where the aforementioned structures are formed, and the first conductive thin film is patterned by a patterning process to form a first insulation layer 211 and a first gate metal layer disposed on the first insulation layer 211. For example, the first gate metal layer may at least include a gate of the first transistor 201, a gate of the second transistor 202 and a first electrode plate of the storage capacitor 203.

In some examples, after the first gate metal layer is formed, the semiconductor layer may be subjected to a conductive treatment using the first gate metal layer as a shielding, the semiconductor layer in a region shielded by the first gate metal layer may form a channel region of the transistor, and the semiconductor layer in a region not shielded by the first gate metal layer may be subjected to a conductive treatment, that is, both the first region and the second region of the active layer of the plurality of transistors of the pixel circuit are subjected to a conductive treatment.

Subsequently, a second insulation thin film and a second conductive film are sequentially deposited on the base substrate where the aforementioned structures are formed, and the second conductive thin film is patterned by a patterning process to form a second insulation layer 212 and a second gate metal layer disposed on the second insulation layer 212. For example, the second gate metal layer may include at least a second electrode plate of the storage capacitor 203. An orthographic projection of the second electrode plate of the storage capacitor 203 on the base substrate may be at least partially overlapped with an orthographic projection of the first electrode plate on the base substrate.

Subsequently, a third insulation thin film is deposited on the base substrate where the aforementioned structures are formed and the third insulation thin film is patterned by a patterning process to form a third insulation layer 213. The third insulation layer 213 may be provided with a plurality of vias. For example, the plurality of vias of the third insulation layer 213 may expose surfaces of the semiconductor layer, the first gate metal layer and the second gate metal layer, respectively.

Subsequently, a third conductive film is deposited on the base substrate where the aforementioned structures are formed, the third conductive film is patterned by a patterning process to form a first source-drain metal layer on the third insulation layer 213. For example, the first source-drain metal layer may at least include a first electrode and a second electrode of the first transistor 201 and a first electrode and a second electrode of the second transistor 202. For example, the second electrode of the first transistor 201 and the first electrode of the second transistor 202 may form an integral structure. Subsequently, a fourth insulation thin film is coated on the base substrate where the aforementioned structures are formed, and a fourth insulation layer 214 is formed by a patterning process.

In some examples, the buffer layer 210, the first insulation layer 211, the second insulation layer 212, and the third insulation layer 213 may be inorganic insulation layers, and the fifth insulation layer 214 may be an organic insulation layer. For example, the buffer layer 210, the first insulation layer 211, the second insulation layer 212, and the third insulation layer 213 may be made of any one or more of Silicon Oxide (SiOx), Silicon Nitride (SiNx), and Silicon Oxynitride (SiON), and may be a single layer, a multi-layer, or a composite layer. The first insulation layer 211 and the second insulation layer 212 may be referred to as Gate Insulation (GI) layers, the third insulation layer 213 may be referred to as an Interlayer Dielectric (ILD) layer, and the fourth insulation layer 214 may be referred to as a planarization layer. The first gate metal layer, the second gate metal layer and the third gate metal layer may be made of metal material, such as any one or more of silver (Ag), copper (Cu), aluminum (Al), titanium (Ti) and molybdenum (Mo), or alloy of the above metals, such as aluminum neodymium alloy (AlNd) or molybdenum niobium alloy (MoNb), and may have a single-layered structure or a multi-layered composite structure, such as Ti/Al/Ti. The semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene or polythiophene, that is, the present disclosure is applicable to transistors manufactured based on oxide technology, silicon technology or organic technology.

(3) A light emitting structure layer 103 is formed. In some examples, the light emitting structure layer 103 may include a plurality of light emitting elements.

In some examples, an anode thin film is deposited on the base substrate where the aforementioned structures are formed, and the anode thin film is patterned through a patterning process to form an anode layer. For example, the anode layer may include a first anode 301a of the first light emitting unit and a second anode 301b of the second light emitting unit. The first anode 301a and the second anode 301b may be independent of each other. The planes where the first anode 301a and the second anode 301b are located may be flush. The first anode 301a may be electrically connected to the second electrode of the first transistor 201 of the pixel circuit through a via provided by the fourth insulation layer 214, and the second anode 301b may be electrically connected to the second electrode of the second transistor 202 of the pixel circuit through a via provided by the fourth insulation layer 214.

Subsequently, a pixel definition thin film is coated on the base substrate where the aforementioned structures are formed, and a pixel definition layer 304 is formed through mask, exposure, and development processes. The pixel definition layer 304 is formed with a plurality of pixel openings exposing the anode layer. For example, the plurality of pixel openings may include a first pixel opening and a second pixel opening. The first pixel opening may expose at least a portion of the first anode 301a, and the second pixel opening may expose at least a portion of the second anode 301b.

Subsequently, an organic light emitting layer is formed within the pixel openings. For example, a first organic light emitting layer 302a is formed within the first pixel opening and connected to the first anode 301a; a second organic light emitting layer 302b is formed in the second pixel opening and connected to the second anode 301b.

Subsequently, a cathode thin film is deposited, and the cathode thin film is patterned through a patterning process to form a cathode layer. For example, the cathode layer may include a first cathode 303a of the first light emitting unit and a second cathode 303b of the second light emitting unit. The first cathode 303a is connected to the first organic light emitting layer 302a, and the second cathode 303b is connected to the second organic light emitting layer 302b. The first cathode 303a and the second cathode 303b may form an integral structure. The first organic light emitting layer 302a can emit light of a corresponding color under the action of the voltage applied by the first anode 301a and the first cathode 303a; the second organic light emitting layer 302b can emit light of corresponding colors under the action of the voltage applied by the second anode 301b and the second cathode 303b. For example, the first light emitting unit and the second light emitting unit of the first sub-pixel P1 may both be configured to emit red light.

In some examples, the pixel definition layer 304 may be made of an organic material such as polyimide, acrylic, polyethylene terephthalate or acrylics. For example, the pixel definition layer 304 may be black. By providing the black pixel definition layer 304, reflected light and refracted light in the film layer can be absorbed and the light emitting effect of the light emitting element can be improved. However, this embodiment is not limited thereto.

In some examples, the organic light emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) which are stacked. In some examples, the first organic light emitting layer 302a of the first light emitting unit and the second organic light emitting layer 302a of the second light emitting unit may be isolated from each other. However, this embodiment is not limited thereto. For example, in some examples, hole injection layers of all sub-pixels may be connected together to form a common layer, electron injection layers of all the sub-pixels may be connected together to form a common layer, hole transport layers of all the sub-pixels may be connected together to form a common layer, electron transport layers of all the sub-pixels may be connected together to form a common layer, hole block layers of all the sub-pixels may be connected together to form a common layer, emitting layers of adjacent sub-pixels may be overlapped slightly or may be isolated from each other, and electron block layers of adjacent sub-pixels may be overlapped slightly or may be isolated from each other.

In some examples, the light emitting region of the light emitting unit may be an overlapped region of the anode and the organic light emitting layer and the cathode exposed by the pixel opening of the pixel definition layer. For example, the light emitting region of the first light emitting unit may be an overlapped region of the first anode, the first organic light emitting layer, and the first cathode within the first pixel opening of the pixel definition layer. The light emitting region of the second light emitting unit may be an overlapped region of the second anode, the second organic light emitting layer, and the second cathode within the second pixel opening of the pixel definition layer.

(4) An encapsulation structure layer 104 is formed. In some examples, the encapsulation structure layer 104 is located on a side of the cathode layer away from the base substrate 101. The encapsulation structure layer 104 may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer may be disposed between the first encapsulation layer and the third encapsulation layer, to ensure that external water vapor cannot enter the light emitting structure layer 103. In some examples, a stacked structure of an inorganic material/ organic material/inorganic material/organic material/inorganic material may be adopted for the encapsulation structure layer 104.

(5) A first shielding layer 105 is formed. In some examples, a black pigment is coated or a black chromium (Cr) thin film is deposited on the base substrate where the aforementioned structures are formed, and the black pigment or the black chromium thin film is patterned by a patterning process to form the first shielding layer 105. As shown in FIG. 7, an orthographic projection of the first shielding layer 105 on the base substrate 101 may be within a range of an orthographic projection of the pixel definition layer 304 on the base substrate 101.

Figure 8:
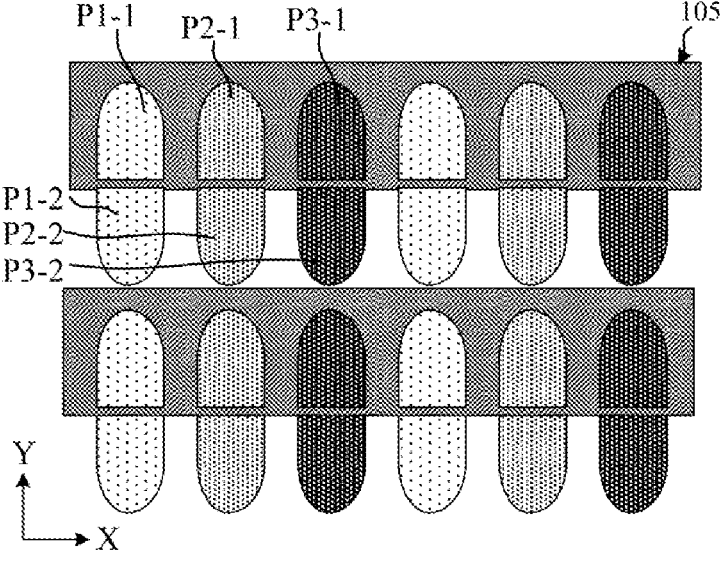
FIG. 8 is a schematic plane view of an first shielding layer according to at least one embodiment of the present disclosure.

FIG. 8 is a schematic plane view of a first shielding layer according to at least one embodiment of the present disclosure. In some examples, as shown in FIG. 8, the orthographic projection of the first shielding layer 105 on the base substrate may be not overlapped with the orthographic projection of the light emitting regions of the light emitting elements of the first sub-pixel, the second sub-pixel and the third sub-pixel on the base substrate. The orthographic projection of the first shielding layer 105 on the base substrate may surround an orthographic projection of the first light emitting unit P1-1 of the first sub-pixel, the first light emitting unit P2-1 of the second sub-pixel, and the first light emitting unit P3-1 of the third sub-pixel. For example, the orthographic projection of the first shielding layer 105 on the base substrate may surround an orthographic projection of a light emitting region of the first light emitting unit P1-1 of the first sub-pixel, a light emitting region of the first light emitting unit P2-1 of the second sub-pixel, and a light emitting region of the first light emitting unit P3-1 of the third sub-pixel. In other words, the light emitting region of the first light emitting unit P1-1, the light emitting region of the first light emitting unit P2-1 of the second sub-pixel, and the light emitting region of the first light emitting unit P3-1 of the third sub-pixel may be surrounded by the first shielding layer 105. The first shielding layer 105 may not be provided between adjacent second light emitting units. In this example, by providing the first shielding layer 105 around a periphery of the first light emitting unit, an emitting angle of the first light emitting unit can be limited, so that the emitted light of the first light emitting unit is concentrated in the positive viewing angle direction, which is beneficial to realizing the anti-peep effect.

(6) A first protective layer 106 is formed. In some examples, a first protective thin film is coated on the base substrate where the aforementioned structures are formed, and a first protective (OC, Over Coat) layer 106 is formed by a patterning process. In some examples, the first protective layer 106 may be made of a material such as an acrylate.

(7) A second shielding layer 107 is formed. In some examples, a black pigment is coated or a black chromium (Cr) thin film is deposited on the base substrate where the aforementioned structures are formed, and the black pigment or the black chromium thin film is patterned by a patterning process to form the second shielding layer 107.

In some examples, an orthographic projection of the second shielding layer 107 on the base substrate 101 may be within the range of the orthographic projection range of the pixel definition layer 304 on the base substrate 101. The orthographic projection of the second shielding layer 107 on the base substrate may surround the first light emitting unit and may be not overlapped with the orthographic projection of the light emitting regions of the first light emitting unit and the second light emitting unit on the base substrate. For example, the orthographic projection of the second shielding layer 107 on the base substrate may be within a range of the orthographic projection of the first shielding layer 105 on the base substrate. For example, the orthographic projection of the second shielding layer 107 on the base substrate may coincide with the orthographic projection of the first shielding layer 105 on the base substrate. However, this embodiment is not limited thereto.

In this example, by providing two shielding layers (i.e., the first shielding layer 105 and the second shielding layer 107) to surround the first light emitting unit, the emitting angle of the first light emitting unit can be limited, thereby facilitating the realization of the anti-peep effect. The number of shielding layers is not limited in this embodiment. In some other examples, the number of shielding layers may be greater than or equal to three, and a protective layer may be provided between adjacent shielding layers. In other examples, the shielding layer may surround the light emitting element.

The structure of the display panel of the exemplary embodiment of the present disclosure and the manufacturing process thereof are described only as an example. In some exemplary implementations, a corresponding structure may be changed and a patterning process may be increased or decreased according to actual needs. For example, the display structure layer may further include a second source-drain metal layer located on a side of the first source-drain metal layer away from the base substrate, the second source-drain metal layer may include an anode connection electrode, and the first anode of the first light emitting unit and the second anode of the second light emitting unit may be electrically connected to the pixel circuit through the anode connection electrode, respectively. However, the present disclosure is not limited thereto.

Figure 9:
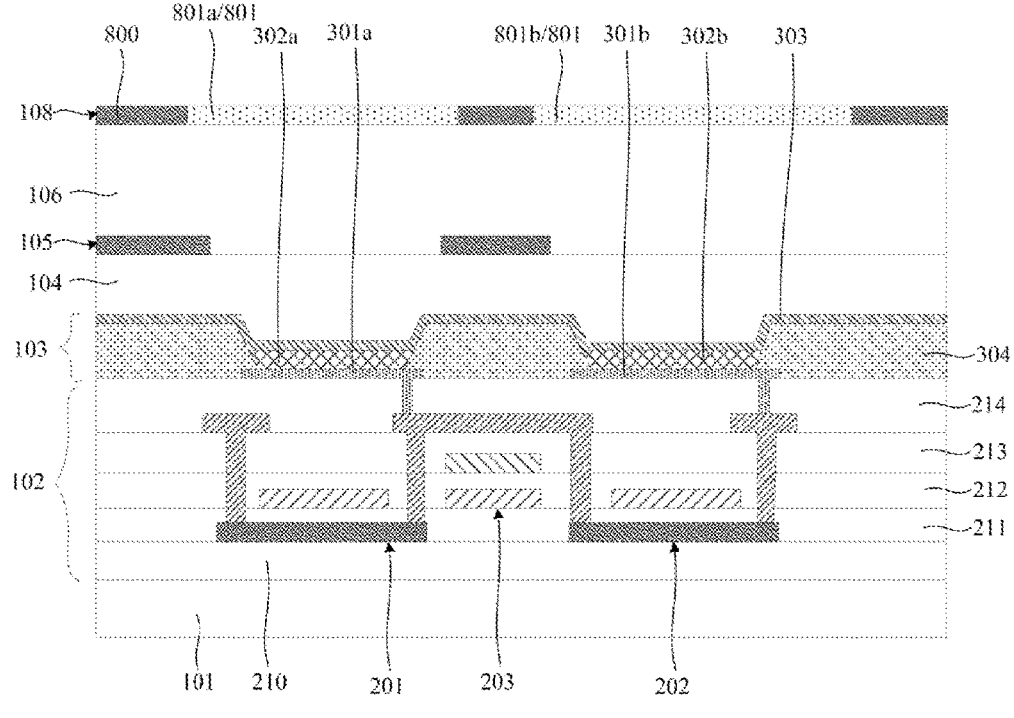
FIG. 9 is another partial cross-sectional schematic diagram taken along a Q-Q' direction in FIG. 3.

FIG. 9 is another partial cross-sectional schematic diagram taken along Q-Q' direction in FIG. 3. In some examples, as shown in FIG. 9, in a direction perpendicular to the display panel, the display panel may include a base substrate 101, and a display structure layer, an encapsulation structure layer 104, a first shielding layer 105, a first protective layer 106 and a color filter layer 108 sequentially disposed on the base substrate 101. The display structure layer includes a circuit structure layer 102 and a light emitting structure layer 103 which are sequentially disposed on the base substrate 101. The description of the structures of the display structure layer, the encapsulation structure layer 104, the first shielding layer 105 and the first protective layer 106 may reference to the foregoing embodiments, and therefore will not be repeated here.

In some examples, as shown in FIG. 9, the color filter layer 108 may be located on a side of the first protective layer 106 away from the base substrate 101. The color filter layer 108 may include a plurality of filter units arranged periodically and a black matrix 800 disposed between adjacent filter units. The plurality of filter units may correspond to the light emitting elements of the plurality of sub-pixels one by one. For example, the plurality of filter units may include a first filter unit 801, a second filter unit and a third filter unit. The first filter unit 801 may correspond to the light emitting element of the first sub-pixel P1, the second filter unit may correspond to the light emitting element of the second sub-pixel P2, and the third filter unit may correspond to the light emitting element of the third sub-pixel P3. For example, the first filter unit 801 may be a red filter unit, the second filter unit may be a green filter unit, and the third filter unit may be a blue filter unit.

In the present embodiment, the filter unit can let light of a single color pass through and absorb light of other colors. For example, a blue filter unit can let blue light pass through and absorb light of other colors, a red filter unit can let red light pass through and absorb light of other colors, and a green filter unit can let green light pass through and absorb light of other colors.

In some examples, the at least one filter unit may include a first sub-filter unit and a second sub-filter unit. An orthographic projection of the filter unit on the base substrate can cover the orthographic projection of the light emitting region of the corresponding light emitting element on the base substrate. For example, as shown in FIG. 9, the first filter unit 801 may include a first sub-filter unit 801*a* and a second sub-filter unit 801*b*. An orthographic projection of the first sub-filter unit 801*a* on the base substrate 101 may cover the orthographic projection of the light emitting region of the first light emitting unit of the first sub-pixel on the base substrate 101; an orthographic projection of the second sub-filter unit 801*b* on the base substrate 101 may cover the orthographic projection of the light emitting region of the second light emitting unit of the first sub-pixel on the base substrate 101. However, this embodiment is not limited thereto. In some other examples, the orthographic projection of the filter unit on the base substrate may cover the orthographic projection of the light emitting regions of the first light emitting unit and the second light emitting unit of the corresponding light emitting element on the base substrate.

In some examples, after the first protective layer 106 is manufactured, the color filter layer 108 may be manufactured by the followings: a black pigment is coated or a black chromium (Cr) thin film is deposited on the first protective layer 106, the black pigment or the black chromium thin film is patterned by a patterning process to form a black matrix 800; subsequently, a plurality of first filter units 801, a plurality of second filter units and a plurality of third filter units are formed in sequence. Taking the first filter unit 801 being a red filter unit as an example, the first protective layer 106 formed with the black matrix 800 formed is coated with a red resin at first, and the red filter units are formed by masking, exposure and development after baking-curing.

The green filter units and the blue filter units are formed through similar processes, which will not be repeated herein.

In this example, by providing a shielding layer (i.e., the first shielding layer) and a color filter layer, the emitting angle of the first light emitting unit is limited, thereby facilitating the realization of the anti-peep effect. The number of shielding layers is not limited in this embodiment. In other examples, at least two shielding layers may be provided between the encapsulation structure layer and the color filter layer, and a protective layer may be provided between adjacent shielding layers.

Figure 10:
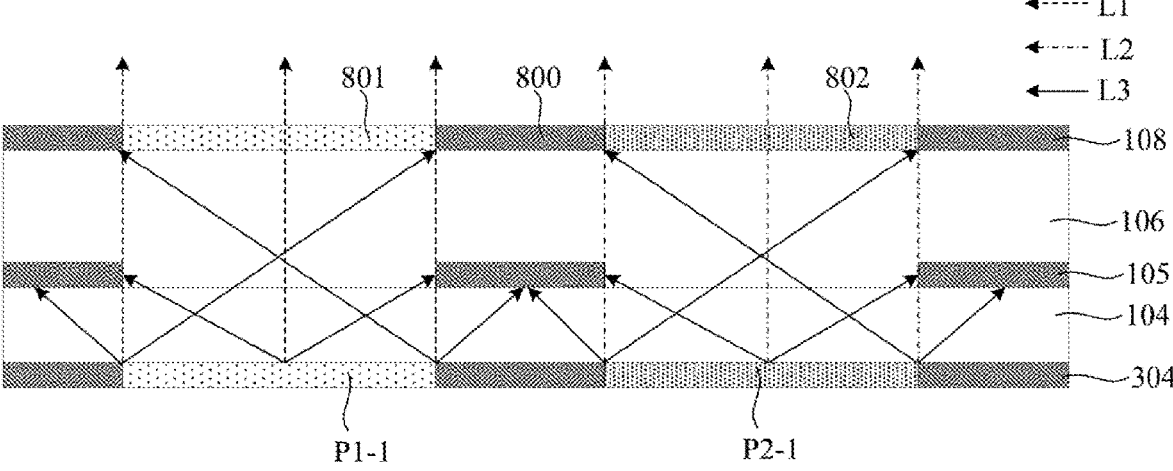
FIG. 10 is a schematic view of light emission of the cross-sectional structure taken along R-R' direction in FIG. 3.
Figure 11:
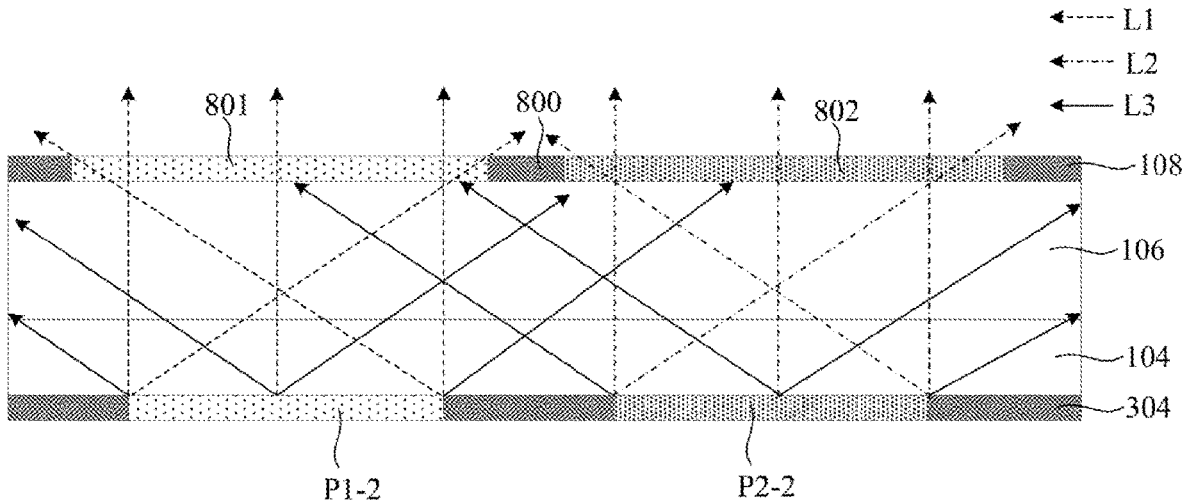
FIG. 11 is a schematic view of light emission of the cross-sectional structure taken along U-U' direction in FIG. 3.

FIG. 10 is a schematic view of light emission of the cross-sectional structure taken along R-R' direction in FIG. 3. FIG. 11 is a schematic view of light emission of the cross-sectional structure taken along U-U' direction in FIG. 3. Partial film layers of the display structure layer and the base substrate are schematically omitted in FIGS. 10 and 11. FIG. 10 is a schematic exemplary illustration of the emitted light of the first light emitting unit P1-1 of the first sub-pixel P1 and the first light emitting unit P2-1 of the second sub-pixel P2 as an example; FIG. 11 a schematic exemplary illustration of the emitted light of the second light emitting unit P1-2 of the first sub-pixel P1 and the second light emitting unit P2-2 of the second sub-pixel P2. An emitted light L1 of the first sub-pixel P1 may be represented by a dash line with an arrow, an emitted light L2 of the second sub-pixel P2 may be represented by a dot dash line with an arrow, and a light ray L3 absorbed by the film layer in the display panel may be represented by a solid line with an arrow.

In this example, the positive viewing angle direction may be a direction perpendicular to the plane where the display panel is located. A squint angle direction may refer to the line of sight direction other than the positive angle direction.

In some examples, as shown in FIGS. 3 and 10, the orthographic projection of the first shielding layer 105 on the base substrate may surround the light emitting region of the first light emitting unit P1-1. The emitted light of the first light emitting unit P1-1 of the first sub-pixel P1 can be emitted along the positive viewing angle direction, the emitted light of the first light emitting unit P1-1 in the right squint viewing angle direction is absorbed by the black matrix 800 of the first shielding layer 105 and the color filter layer 108, and the emitted light of the first light emitting unit P1-1 in the left squint viewing angle direction is absorbed by the black matrix 800 of the first shielding layer 105 and the color filter layer 108. Similarly, the emitted light of the first light emitting unit P2-1 of the second sub-pixel P2 can be emitted along the positive viewing direction, and the emitted light of the squint viewing direction is absorbed by the black matrix 800 of the first shielding layer 105 and the color filter layer 108. In this example, when the first light emitting unit is illuminated, the emitting angle of the emitted light of the first light emitting unit is limited by the black matrix 800 of the first shielding layer 105 and the color filter layer 108, and the anti-peep effect of the display panel along the first direction X can be improved.

In some examples, as shown in FIGS. 3 and 11, no first shielding layer is provided between adjacent second light emitting units (e.g. the second light emitting units P1-2 and P2-2). A size of the black matrix 800 between adjacent second light emitting units may be smaller than a size of the black matrix 800 between adjacent first light emitting units. The emitted light of the second light emitting unit P1-2 of the first sub-pixel P1 can be emitted not only in the positive viewing angle direction, but also in the partial squint viewing angle direction. An emitting angle of the emitted light of the second light emitting unit in this example may be larger than an emitting angle of the emitted light of the first light emitting unit. In the sharing display mode of the display panel, the first light emitting unit and the second light emitting unit can be illuminated at the same time, and the emitting angle of the emitted light of the second light emitting unit is larger than that of the emitted light of the first light emitting unit, which is beneficial to realizing the shared display effect, thereby improving the user experience.

Figure 12:
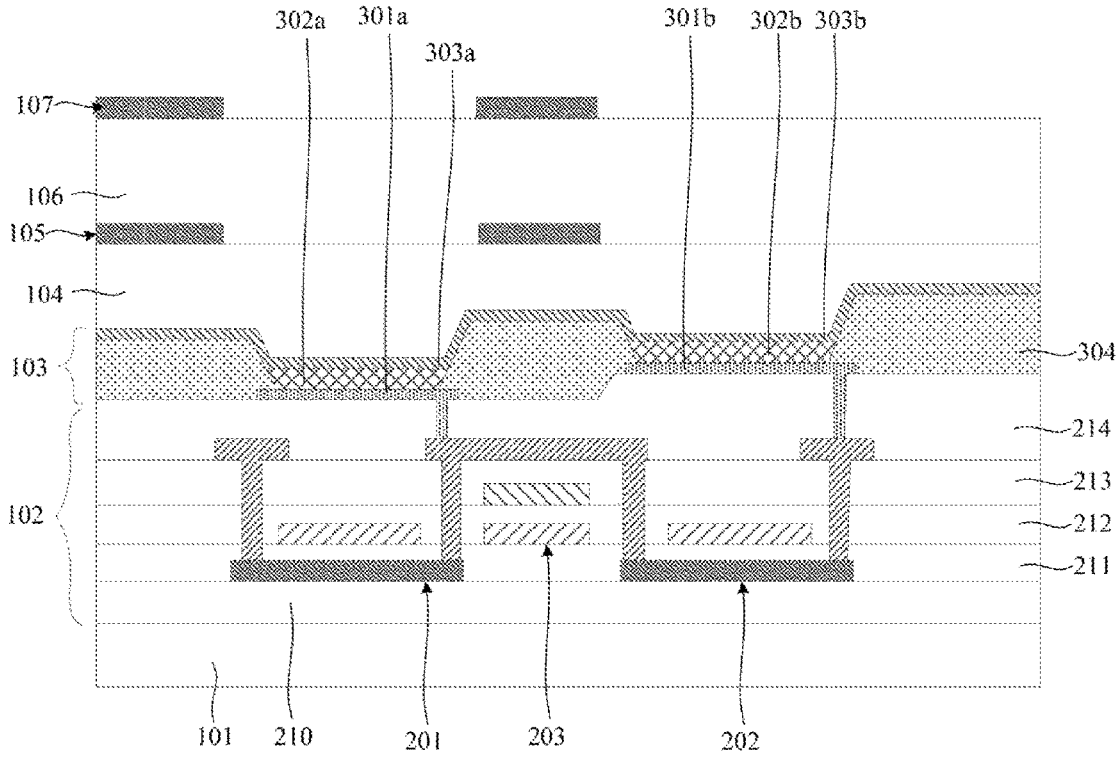
FIG. 12 is another partial cross-sectional schematic diagram taken along Q-Q' direction in FIG. 3.

FIG. 12 is another partial cross-sectional schematic diagram taken along Q-Q' direction in FIG. 3. In some examples, as shown in FIG. 12, in a direction perpendicular to the display panel, the display panel may include a base substrate 101, and a display structure layer, an encapsulation structure layer 104, a first shielding layer 105, a first protective layer 106 and a second shielding layer 107 sequentially disposed on the base substrate 101. The display structure layer includes a circuit structure layer 102 and a light emitting structure layer 103 which are sequentially disposed on the base substrate 101. In this example, the first anode 301a of the first light emitting unit P1-1 and the second anode 201b of the second light emitting unit P1-2 may not be located in the same plane. The first anode 301a may be located on a side of the second anode 301b close to the base substrate 101. A thickness of the fourth insulation layer 214 on a side of the second anode 301b close to the base substrate 101 may be greater than a thickness of the fourth insulation layer 214 on a side of the first anode 301a close to the base substrate 101, such that the first anode 301a and the second anode 301b are not in the same plane. A height of the pixel definition layer 304 around the second anode 301b may be greater than a height of the pixel definition layer 304 around the first anode 301a.

In this embodiment, a height of a film layer may refer to a distance from a surface on a side of the film layer away from the base substrate to the plane where the base substrate is located. A thickness of a film layer may refer to a distance between a surface of a film layer away from the base substrate and a surface of the film layer close to the base substrate.

In some examples, as shown in FIGS. 3 and 12, a distance between the first anode 301a of the first light emitting unit P1-1 and a light emitting surface (for example, a surface on a side of the first protective layer 106 away from the base substrate 101) is larger than a distance between the second anode 301b of the second light emitting unit P1-2 and the light emitting surface, so that a range of the emitting angle of the first light emitting unit P1-1 is less than a range of the emitting angle of the second light emitting unit P1-2. The emitted light of the first light emitting unit P1-1 is concentrated in the positive viewing angle direction, and the emitting angle of the emitted light of the second light emitting unit P1-2 may be larger than the emitting angle of the emitted light of the first light emitting unit P1-1. The rest of the structure of the display panel according to the present embodiment may be referred to descriptions of the aforementioned embodiments, and will not be repeated here.

In this example, by arranging the first anode of the first light emitting unit and the second anode of the second light emitting unit not in the same plane, and the first anode is located on a side of the second anode close to the base substrate, the emitting angle of the second light emitting unit can be increased. In this way, the anti-peep display effect can be realized when the first light emitting unit is illuminated, and the shared display effect can be realized when the first light emitting unit and the second light emitting unit are illuminated at the same time.

Figure 13:
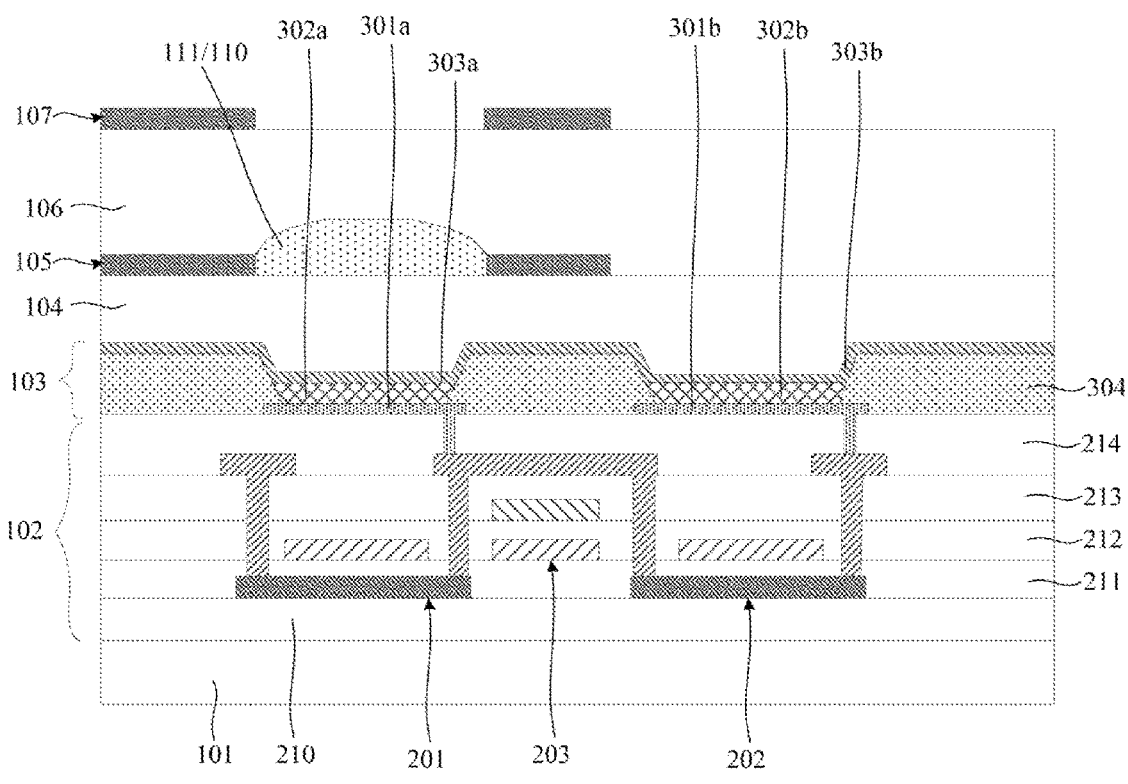
FIG. 13 is another partial cross-sectional schematic diagram taken along Q-Q' direction in FIG. 3.

FIG. 13 is another partial cross-sectional schematic diagram taken along Q-Q' direction in FIG. 3. In some examples, as shown in FIG. 13, in a direction perpendicular to the display panel, the display panel may include a base substrate 101, and a display structure layer, a encapsulation structure layer 104, a first shielding layer 105, a first protective layer 106, a light adjustment layer 110 and a second shielding layer 107 sequentially disposed on the base substrate 101. The display structure layer includes a circuit structure layer 102 and a light emitting structure layer 103 which are sequentially disposed on the base substrate 101. In this example, the light adjustment layer 110 may be provided on a side of the first shielding layer 105 away from the base substrate 101. The light adjustment layer 110 may include at least one lens unit 111. An orthographic projection of the lens unit 111 on the base substrate 101 may be at least partially overlapped with the orthographic projection of the light emitting region of the first light emitting unit P1-1 on the base substrate. For example, the lens unit 111 may be a convex lens. The orthographic projection of the lens unit 111 on the base substrate 101 may cover the orthographic projection of the light emitting region of the first light emitting unit P1-1 on the base substrate 101. In other examples, the lens unit 111 may include a plurality of sub-lens units arranged in an array, and an orthographic projection of the plurality of sub-lens units on the base substrate may be located within a range of the orthographic projection of the light emitting region of the first light emitting unit on the base substrate. In some examples, a refractive index of the light adjustment layer 110 may be greater than the refractive index of the first protective layer 106. The rest of the structure of the display panel according to the present embodiment may be referred to descriptions of the aforementioned embodiments, and will not be repeated here.

In this example, the light adjustment layer is disposed on an emitted light path of the first light emitting unit, which is beneficial to improve a light emitting efficiency of the first light emitting unit, thereby ensuring the anti-peep display effect when the first light emitting unit is illuminated.

Figure 14:
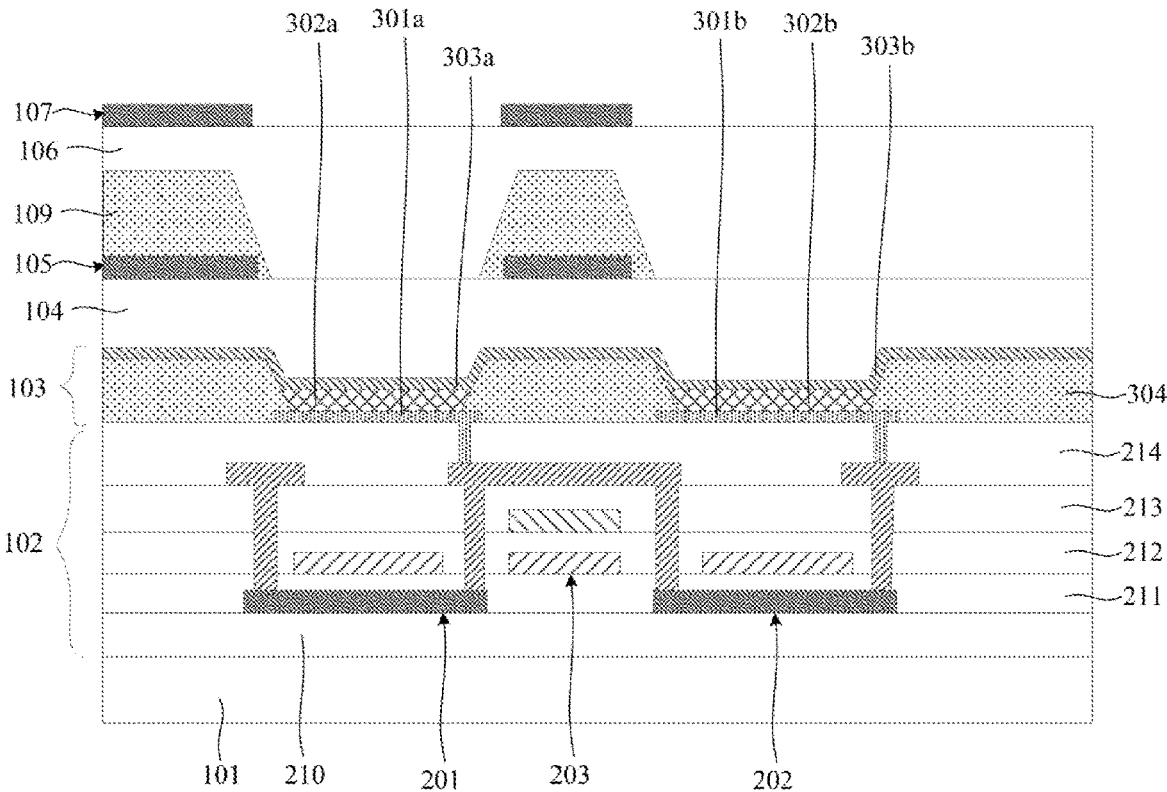
FIG. 14 is another partial cross-sectional schematic diagram taken along Q-Q' direction in FIG. 3.

FIG. 14 is another partial cross-sectional schematic diagram taken along Q-Q' direction in FIG. 3. In some examples, as shown in FIG. 14, in a direction perpendicular to the display panel, the display panel may include a base substrate 101, and a display structure layer, a encapsulation structure layer 104, a first shielding layer 105, a first protective layer 106, a second protective layer 109 and a second shielding layer 107 sequentially disposed on the base substrate 101. The display structure layer includes a circuit structure layer 102 and a light emitting structure layer 103 which are sequentially disposed on the base substrate 101. In this example, the second protective layer 109 may be located on a side of the first protective layer 106 close to the base substrate 101. An orthographic projection of the second protective layer 109 on the base substrate may cover an orthographic projection of the first shielding layer 105 on the base substrate. An orthographic projection of the first protective layer 106 on the base substrate may cover the orthographic projection of the second protective layer 109 on the base substrate. The orthographic projection of the second protective layer 109 on the base substrate may be not overlapped with the orthographic projection of the light emitting regions of the first light emitting unit and the second light emitting unit on the base substrate. A refractive index of the second protective layer 109 may be less than that of the first protective layer 106. The second protective layer 109 and the first protective layer 106 of the present example can form an EES (Efficiency Enhance Structure), and the emitted light of the first light emitting unit is refracted and totally reflected in the first protective layer 106 and the second protective layer 109, so that the emitted light is concentrated in the positive viewing angle direction, thereby realizing the anti-peep display effect. The rest of the structure of the display panel according to the present embodiment may be referred to descriptions of the aforementioned embodiments, and will not be repeated here.

In this example, the ESS is formed by the first protective layer and the second protective layer, which is beneficial to improve the light emitting efficiency of the first light emitting unit, thereby ensuring the anti-peep display effect when the first light emitting unit is illuminated.

Figure 15:
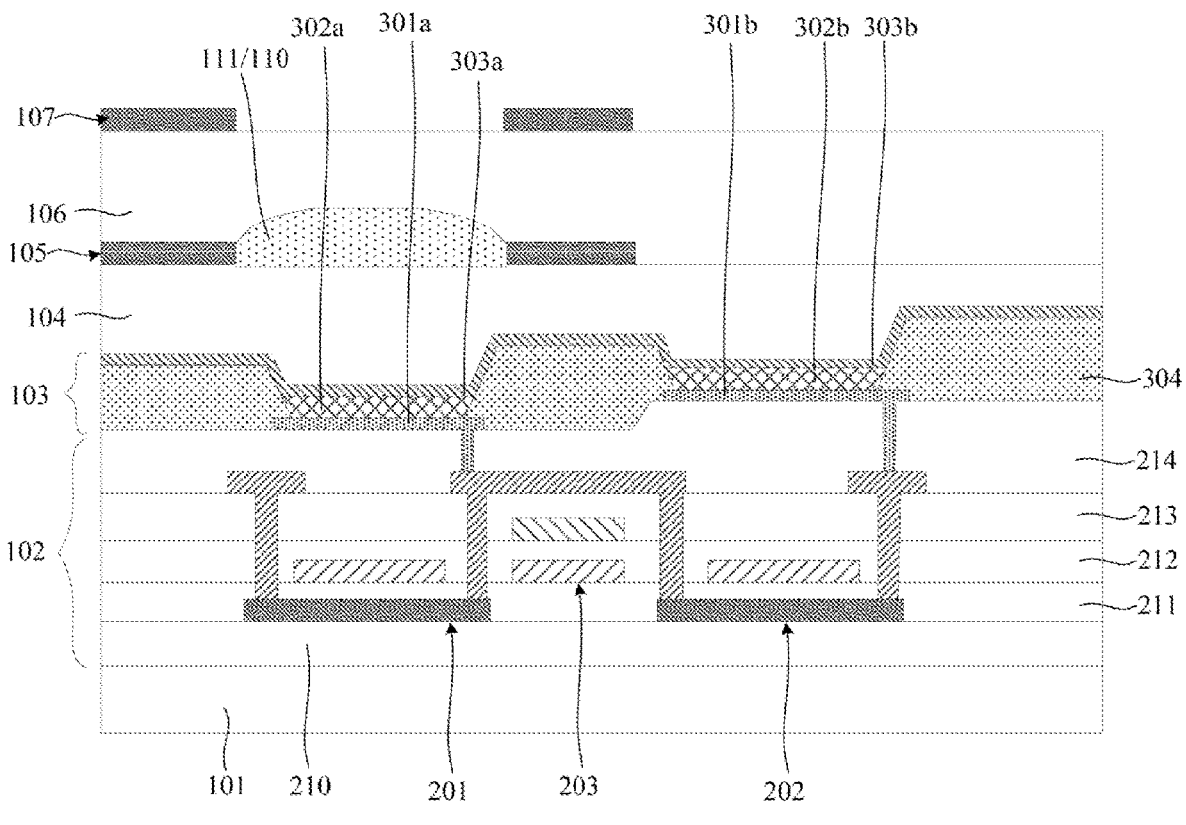
FIG. 15 is another partial cross-sectional schematic diagram taken along Q-Q' direction in FIG. 3.

FIG. 15 is another partial cross-sectional schematic diagram taken along Q-Q' direction in FIG. 3. In some examples, as shown in FIG. 15, in a direction perpendicular to the display panel, the display panel may include a base substrate 101, and a display structure layer, a encapsulation structure layer 104, a first shielding layer 105, a light adjustment layer 110, a first protective layer 106 and a second shielding layer 107 sequentially disposed on the base substrate 101. In this example, the first anode 301a of the first light emitting unit P1-1 and the second anode 201b of the second light emitting unit P1-2 are not located in the same plane. The first anode 301a may be located on a side of the second anode 301b close to the base substrate 101. The rest of the structure of the display panel according to the present embodiment may be referred to descriptions of the aforementioned embodiments, and will not be repeated here.

In this example, by arranging the first anode of the first light emitting unit and the second anode of the second light emitting unit not in the same plane, and the first anode is located on a side of the second anode close to the base substrate, the emitting angle of the second light emitting unit can be increased, and by arranging the light adjustment layer on the emitted light path of the first light emitting unit, the light emitting efficiency of the first light emitting unit can be improved, thereby ensuring the anti-peep display effect when the first light emitting unit is illuminated.

Figure 16:
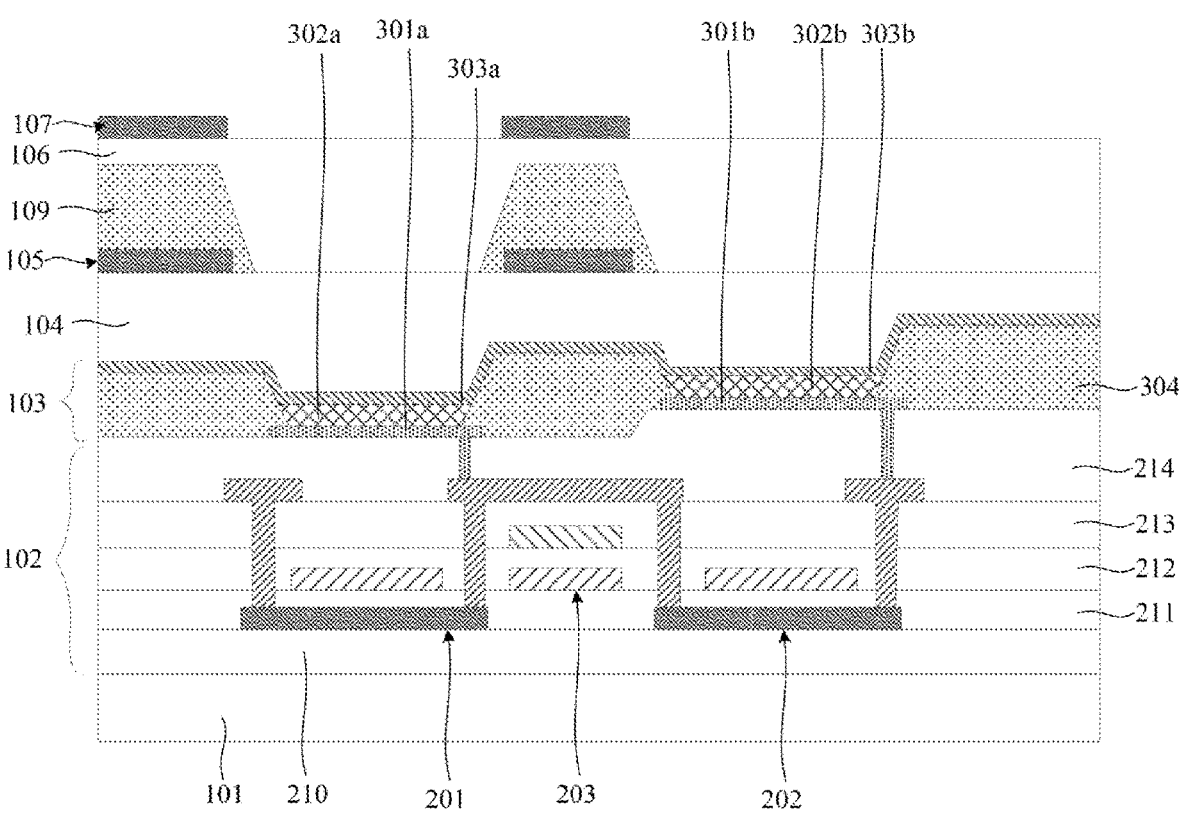
FIG. 16 is another partial cross-sectional schematic diagram taken along Q-Q' direction in FIG. 3.

FIG. 16 is another partial cross-sectional schematic diagram taken along Q-Q' direction in FIG. 3. In some examples, as shown in FIG. 16, in a direction perpendicular to the display panel, the display panel may include a base substrate 101, and a display structure layer, a encapsulation structure layer 104, a first shielding layer 105, a first protective layer 106, a second protective layer 109 and a second shielding layer 107 sequentially disposed on the base substrate 101. In this example, the first anode 301a of the first light emitting unit P1-1 and the second anode 201b of the second light emitting unit P1-2 are not located in the same plane. The first anode 301a may be located on a side of the second anode 301b close to the base substrate 101. The rest of the structure of the display panel according to the present embodiment may be referred to descriptions of the aforementioned embodiments, and will not be repeated here.

In this example, by arranging the first anode of the first light emitting unit and the second anode of the second light emitting unit not in the same plane, and the first anode is located on a side of the second anode close to the base substrate, the emitting angle of the second light emitting unit can be increased, and the ESS is formed by the first protective layer and the second protective layer, which is beneficial to improve the light emitting efficiency of the first light emitting unit, thereby ensuring the anti-peep display effect when the first light emitting unit is illuminated.

In other examples, the above embodiments may be combined with each other. For example, the display panel may include a first protective layer, a second protective layer, and a light adjustment layer, and the first anode of the first light emitting unit and the second anode of the second light emitting unit may not be located in the same plane. However, this embodiment is not limited thereto.

Figure 17:
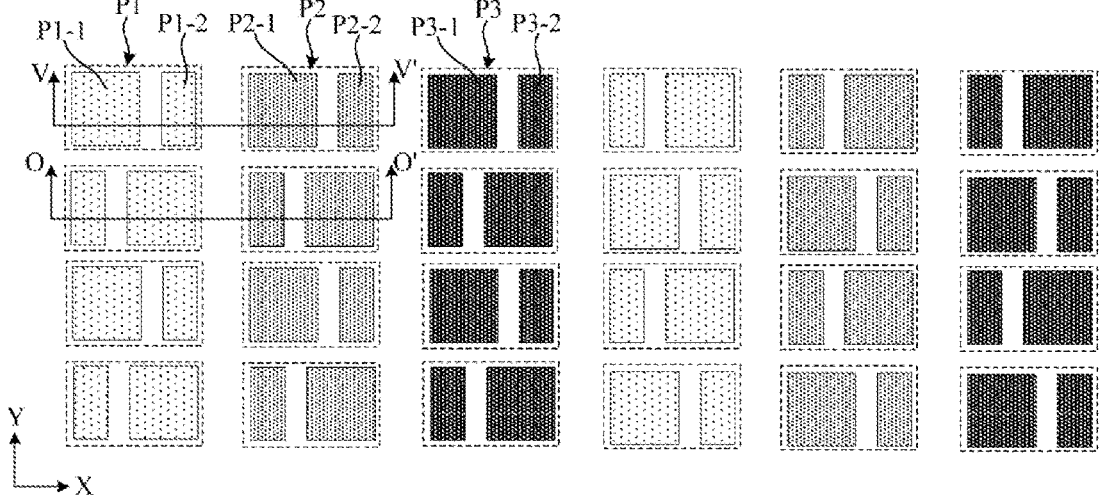
FIG. 17 is another schematic plane view of a sub-pixel of a display panel according to at least one embodiment of the present disclosure.

FIG. 17 is another schematic plane view of a sub-pixel of a display panel according to at least one embodiment of the present disclosure. In some examples, as shown in FIG. 17, a plurality of sub-pixels within the display area of the display panel may be arranged in an array, for example, they may be arranged in sequence along the first direction X and the second direction Y, respectively. Along the first direction X, a first sub-pixel P1, a second sub-pixel P2 and a third sub-pixel P3 can be arranged periodically, and along the second direction Y, the sub-pixels emitting the same color light are arranged in sequence.

In some examples, as shown in FIG. 17, the light emitting elements of at least one sub-pixel may be divided into two light emitting units along the first direction X. For example, the light emitting element of the first sub-pixel P1 may include a first light emitting unit P1-1 and a second light emitting unit P1-2 arranged along the first direction X; the light emitting element of the second sub-pixel P2 may include a first light emitting unit P2-1 and a second light emitting unit P2-2 arranged along the first direction X; the light emitting element of the third sub-pixel P3 may include a first light emitting unit P3-1 and a second light emitting unit P3-2 arranged along the first direction X. The light emitting region of the first light emitting unit and the light emitting region of the second light emitting unit of the at least one light emitting element may be isolated from each other. An area of a light emitting region of the first light emitting unit of the at least one light emitting element may be larger than an area of the light emitting region of the second light emitting unit. The light emitting region of the first light emitting unit and the light emitting region of the second light emitting unit of the at least one light emitting element may be rectangular or rounded rectangular with different sizes. However, this embodiment is not limited thereto. In other examples, the area of the light emitting region of the first light emitting unit of the at least one light emitting element may be less than or equal to the area of the light emitting region of the second light emitting unit.

In some examples, in the anti-peep display mode, the first light emitting unit of the light emitting element of at least one sub-pixel may be configured to emit light and the second light emitting unit may be configured not to emit light; in the sharing display mode, the second light emitting unit may be configured to emit light along with the first light emitting unit.

In some examples, as shown in FIG. 17, the first light emitting units and the second light emitting units of sub-pixels emitting the same color light are alternately arranged along the first direction X and alternately arranged along the second direction Y. In the first direction X, an arrangement order of the first light emitting unit P1-1 and the second light emitting unit P1-2 of one first sub-pixel P1 may be different from an arrangement order of the first light emitting unit P1-1 and the second light emitting unit P1-2 of the adjacent first sub-pixel P1. For example, the first light emitting unit P1-1 of one first sub-pixel P1 may be located on a left side of the second light emitting unit P1-2, and the first light emitting unit P1-1 of a first sub-pixel P1 adjacent in the first direction X may be located on a right side of the second light emitting unit P1-2. In the second direction Y, an arrangement order of the first light emitting unit P1-1 and the second light emitting unit P1-2 of one first sub-pixel P1 may be different from an arrangement order of the first light emitting unit P1-1 and the second light emitting unit P1-2 of the adjacent first sub-pixel P1. For example, the first light emitting unit P1-1 of one first sub-pixel P1 may be located on a left side of the second light emitting unit P1-2, and the first light emitting unit P1-1 of a first sub-pixel P1 adjacent in the second direction Y may be located on a right side of the second light emitting unit P1-2. An arrangement manner of the two light emitting units of each of the second sub-pixel P2 and the third sub-pixel P3 is the same as the arrangement manner of the two light emitting units of the first sub-pixel P1.

Figure 18:
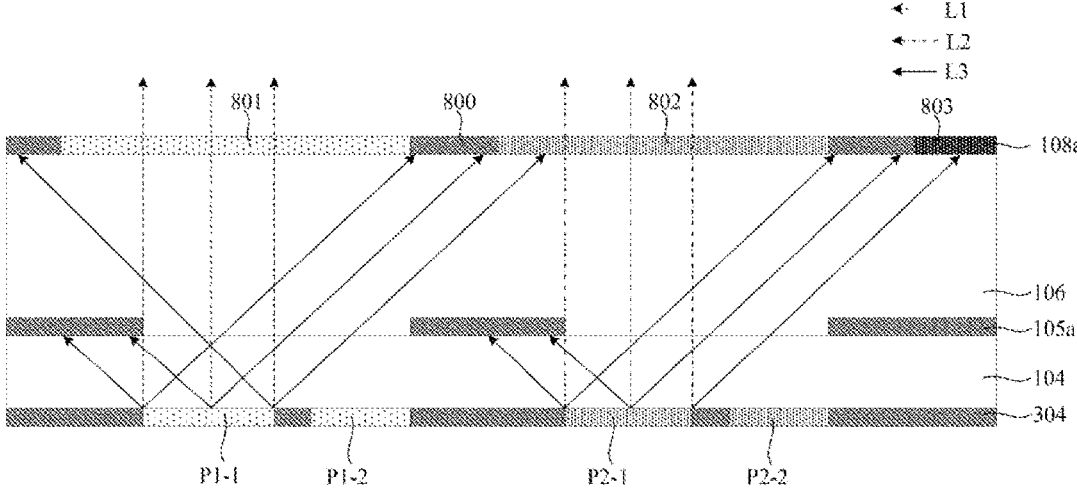
FIG. 18 is a schematic view of light emission of the cross-sectional structure taken along V-V' direction of FIG. 17 in the anti-peep display mode.
Figure 19:
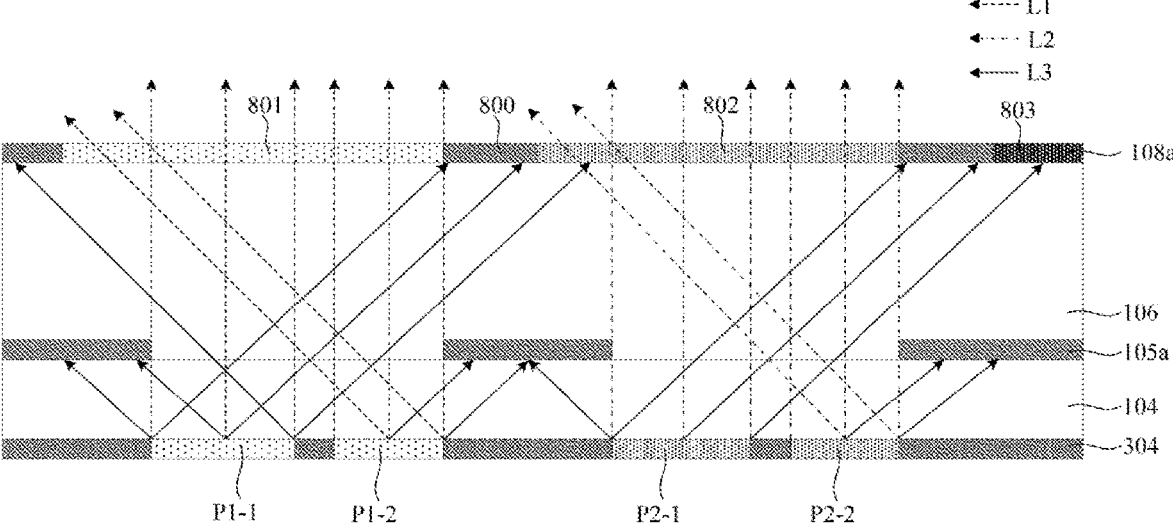
FIG. 19 is a schematic view of light emission of the cross-sectional structure taken along V-V' direction of FIG. 17 in the sharing display mode.
Figure 20:
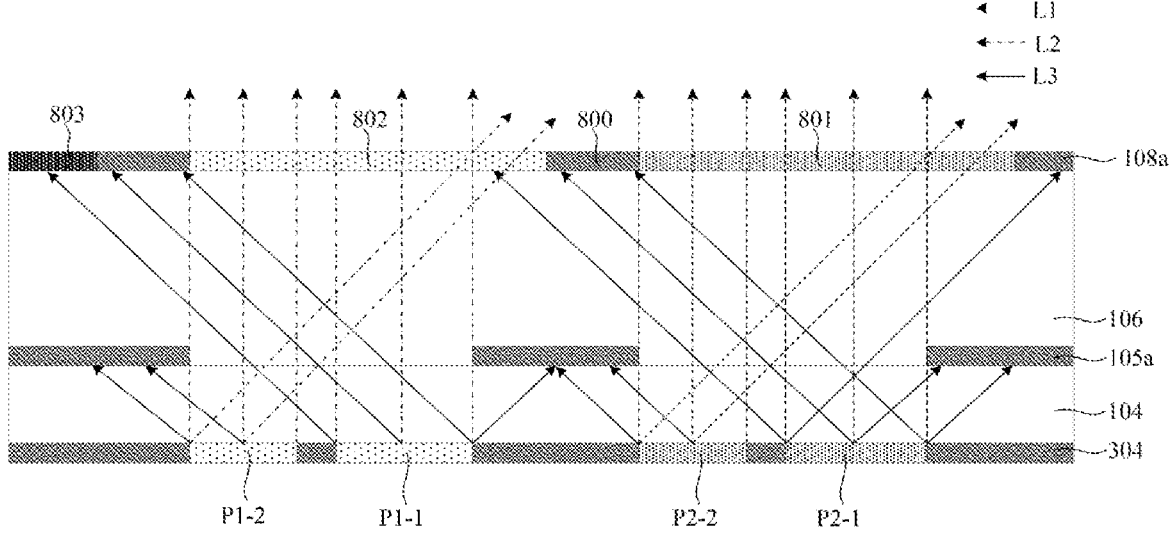
FIG. 20 is a schematic view of light emission of the cross-sectional structure taken along O-O' direction of FIG. 17 in the sharing display mode.
Figure 21:
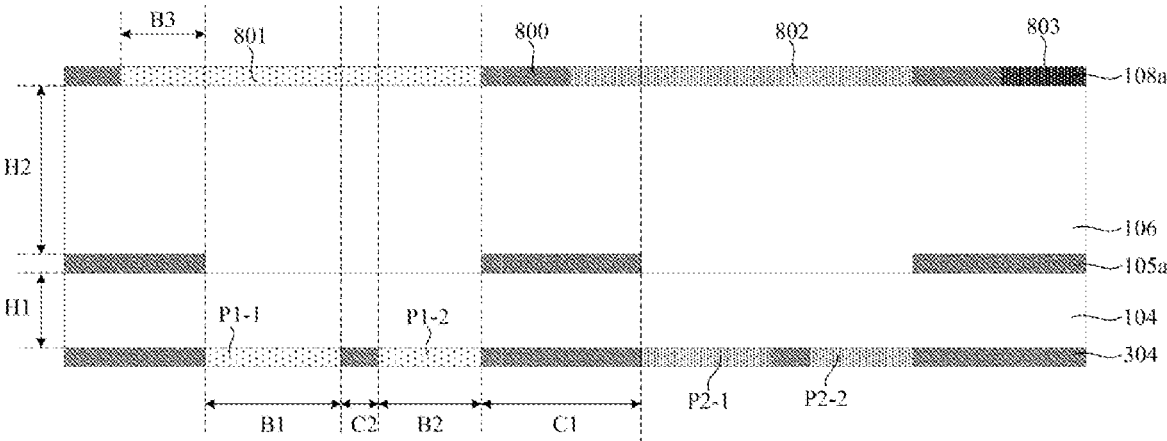
FIG. 21 is a schematic view of the cross-sectional structure taken along V-V' direction in FIG. 17.

FIG. 18 is a schematic view of light emission of the cross-sectional structure taken along V-V' direction of FIG. 17 in the anti-peep display mode. FIG. 19 is a schematic view of light emission of the cross-sectional structure taken along V-V' direction of FIG. 17 in the sharing display mode. FIG. 20 is a schematic view of light emission of the cross-sectional structure taken along O-O' direction of FIG. 17 in the sharing display mode. FIG. 21 is a schematic view of the cross-sectional structure taken along V-V' direction in FIG. 17. Partial film layers of the display structure layer and the base substrate are schematically omitted in FIGS. 18 to 21. FIG. 18 to FIG. 21 are schematically illustrated by taking the emitted light of the first sub-pixel P1 and the second sub-pixel P2 as the example. An emitted light L1 of the first sub-pixel P1 may be represented by a dash line with an arrow, an emitted light L2 of the second sub-pixel P2 may be represented by a dot dash line with an arrow, and a light ray L3 absorbed by the film layer in the display panel may be represented by a solid line with an arrow.

In some examples, as shown in FIGS. 18 to 21, in a direction perpendicular to the display panel, the display panel may include a base substrate, and a display structure layer, an encapsulation structure layer 104, a third shielding layer 105a, a first protective layer 106, and a color filter layer 108a disposed on the base substrate. An orthographic projection of the third shielding layer 105a of the present example on the base substrate may be not overlapped with the orthographic projection of the light emitting region of the light emitting element on the base substrate, and an orthographic projection of the third shielding layer 105a on the base substrate may surround a periphery of the light emitting element. For example, the orthographic projection of the third shielding layer 105a on the base substrate may be within a range of the orthographic projection of the pixel definition layer 304 on the base substrate. However, this embodiment is not limited thereto. In other examples, the orthographic projection of the third shielding layer on the base substrate may surround the orthographic projection of the light emitting region of the first light emitting unit of the light emitting element on the base substrate.

In some examples, as shown in FIGS. 18 to 21, the color filter layer 108a may include a plurality of filter units arranged periodically (including, for example, a first filter unit 801, a second filter unit 802, and a third filter unit 803), and a black matrix 800 disposed between adjacent filter units. The first filter unit 801 may correspond to the light emitting element of the first sub-pixel P1, the second filter unit 802 may correspond to the light emitting element of the second sub-pixel P2, and the third filter unit 803 may correspond to the light emitting element of the third sub-pixel P3. An orthographic projection of the filter unit on the base substrate may cover the orthographic projection of the light emitting region of the light emitting element of the corresponded sub-pixel on the base substrate. An orthographic projection of the black matrix 800 of the color filter layer 108a on the base substrate may be within a range of the orthographic projection of the third shielding layer 105a on the base substrate. However, this embodiment is not limited thereto.

In some examples, as shown in FIGS. 18 to 21, taking the first sub-pixel P1 as an example, in the first direction X, an edge of the light emitting region of the second light emitting unit P1-2 of the first sub-pixel P1 close to the second sub-pixel P2 and an edge of the black matrix 800 close to the first filter unit 801 may be aligned. An orthographic projection of an edge of the first filter unit 801 away from the second filter unit 802 on the base substrate may be overlapped with an orthographic projection of the third shielding layer 105a on the base substrate.

In some examples, as shown in FIGS. 17 and 18, in the anti-peep display mode, the first light emitting unit P1-1 of the first sub-pixel P1 may be configured to emit light, and the second light emitting unit P1-2 may be configured not to emit light. The emitted light of the first light emitting unit P1-1 may be emitted along the positive viewing angle direction, the emitted light of the first light emitting unit P1-1 in the right squint viewing angle direction is absorbed by the black matrix 800 and the second filter unit 802 of the color filter layer 108a, and a part of the emitted light of the first light emitting unit P1-1 in the left squint viewing angle direction may be emitted through the first filter unit 801, and the other part is absorbed by the black matrix 800 and the third shielding layer 105a. An emitting angle of the emitted light of the first light emitting unit P1-1 of the present example is limited by the black matrix 800 of the color filter layer 108a and the third shielding layer 105a.

In some examples, as shown in FIG. 19, in the sharing display mode, the first light emitting unit P1-1 and the second light emitting unit P1-2 of the first sub-pixel P1 may both be configured to emit light. The emitted lights of the first light emitting unit P1-1 and the second light emitting unit P1-2 may be emitted in the positive viewing angle direction. The second light emitting unit P1-2 is located between the first light emitting unit P1-1 and the first light emitting unit P2-1 in the first direction X. The emitted light of the first light emitting unit P1-1 in the right squint direction is absorbed by the black matrix 800 of the color filter layer 108a, the second filter unit 802 and the third shielding layer 105a. A part of the emitted light of the first light emitting unit P1-1 in the left squint direction can be emitted through the first filter unit 801, and the other part is absorbed by the black matrix 800 and the third shielding layer 105a. In the sharing display mode, by simultaneously illuminating the first light emitting unit P1-1 and the second light emitting unit P1-2, the emitting angle of the light emitting element can be increased, thereby improving the sharing display effect.

In some examples, as shown in FIG. 20, in the sharing display mode, the emitted lights of the first light emitting unit P1-1 and the second light emitting unit P1-2 may be emitted in the positive viewing angle direction. The first light emitting unit P1-1 is located between the second light emitting unit P1-2 and the second light emitting unit P2-2 in the first direction X. The emitted light of the first light emitting unit P1-1 and the second light emitting unit P1-2 in the left squint direction is absorbed by the black matrix 800 of the color filter layer 108a, the second light emitting unit 802 and the third shielding layer 105a. A part of the emitted light of the first light emitting unit P1-1 and the second light emitting unit P1-2 in the right squint direction can be emitted through the first filter unit 801, and the other part is absorbed by the black matrix 800 and the third shielding layer 105*a*.

In this example, the emitting angle of the sub-pixel in the sharing display mode is increased compared to the anti-peep display mode. The first light emitting unit and the second light emitting unit of the sub-pixels are arranged alternately along the first direction and along the second direction, so that the sub-pixel can realize the alternation of left emission light and right emission light in the first direction in the sharing display mode, thereby improving the sharing display effect and improving the user experience.

In some examples, as shown in FIG. 21, the pixel definition layer 304 may include a first pixel definition section 3041 located between the first light emitting unit and the second light emitting unit of the same light emitting element (for example, the first light emitting unit P1-1 and the second light emitting unit P1-2), and a second pixel definition section 3042 located between adjacent light emitting elements. A length C2 of the first pixel definition section 3041 along the first direction X may be less than a length C1 of the second pixel definition section 3042 along the first direction X. In other words, a spacing between adjacent light emitting elements may be larger than a spacing between the first light emitting unit and the second light emitting unit of the same light emitting element.

In some examples, as shown in FIG. 21, at least partial edges of the black matrix 800 of the color filter layer 108*a* may be flush with partial edges of the third shielding layer 105*a*. An orthographic projection of the black matrix 800 on the base substrate may be within a range of the orthographic projection of the third shielding layer 105*a* on the base substrate. An orthographic projection of the filter units of the color filter layer 108*a* on the base substrate may cover the orthographic projection of the light emitting regions of the first light emitting unit and the second light emitting unit of the corresponding light emitting element on the base substrate. In some examples, a length of the first light filter unit 801*a* along the first direction X may be greater than the sum of a length B1 of the light emitting region of the first light emitting unit P1-1 along the first direction X, a length B2 of the light emitting region of the second light emitting unit P1-2 along the first direction X, and the length C2 of the first pixel defining section 3041 along the first direction X of the first sub-pixel P1. For example, the length of the first filter unit 801*a* along the first direction may be equal to the sum of the length B1 of the light emitting region of the first light emitting unit P1-1 along the first direction X, the length B2 of the light emitting region of the second light emitting unit P1-2 along the first direction X, the length C2 of the first pixel defining section 3041 along the first direction X, and a first length B3 of the first sub-pixel P1. The first length B3 may be greater than or equal to the length B2 of the light emitting region of the second light emitting unit P1-2 along the first direction X. For example, the length of the first filter unit 801*a* along the first direction may be equal to B1+C2+B2+B3.

In some examples, the sizes of the first light emitting unit and the second light emitting unit of the second sub-pixel and the sizes of the first light emitting unit and the second light emitting unit of the third sub-pixel may be substantially the same as the sizes of the first light emitting unit and the second light emitting unit of the first sub-pixel. The size setting of the first filter unit of the present example facilitates the improvement for the sharing display effect in the sharing display mode. Descriptions for the sizes of the second filter unit and the third filter unit are similar to those of the first filter unit and are therefore not repeated here.

In some examples, as shown in FIG. 21, a thickness H2 of the first protective layer 106 may be greater than or equal to a difference between the sum of the length B1 of the light emitting region of the first light emitting unit P1-1 along the first direction X, the length B2 of the light emitting region of the second light emitting unit P1-2 along the first direction X, the length C2 of the first pixel defining section 3041 along the first direction X and a thickness of the encapsulation structure layer 104. In other words, H2 may be greater than or equal to B1+B2+C2−H1. The thickness setting of the first protective layer of the present example is beneficial to increase the emitting angle of the first light emitting unit and the second light emitting unit in the sharing display mode, thereby improving the sharing display effect in the sharing display mode.

Figure 22:
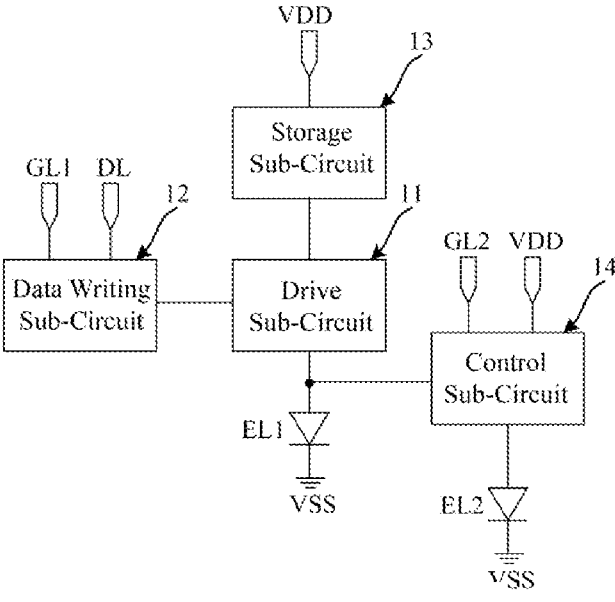
FIG. 22 is another schematic diagram of a pixel circuit according to at least one embodiment of the present disclosure.

FIG. 22 is another schematic diagram of a pixel circuit according to at least one embodiment of the present disclosure. In some examples, as shown in FIG. 22, the pixel circuit may at least include a drive sub-circuit 11, a data writing sub-circuit 12, a storage sub-circuit 13 and a control sub-circuit 14. The data writing sub-circuit 12 may be electrically connected to a first scan line GL1, a data line DL, and a drive sub-circuit 11, and is configured to supply a data signal transmitted by the data line DL to the drive sub-circuit 11 under the control of the first scan line GL1. The drive sub-circuit 11 may be electrically connected to the storage sub-circuit 13, the data writing sub-circuit 12, the control sub-circuit 14 and the first light emitting unit EL1, and is configured to drive the first light emitting unit EL1 to emit light. The storage sub-circuit 13 may be electrically connected to the drive sub-circuit 11 and a first power supply line VDD. The control sub-circuit 14 may be electrically connected to a second scan line GL2, the first power supply line VDD, the drive sub-circuit 11, the first light emitting unit EL1 and a second light emitting unit EL2, and is configured, under the control of the second scan line GL2, to drive the second light emitting unit EL2 to emit light along with the first light emitting unit EL1, or drive the second light emitting unit EL2 to emit light.

Figure 23:
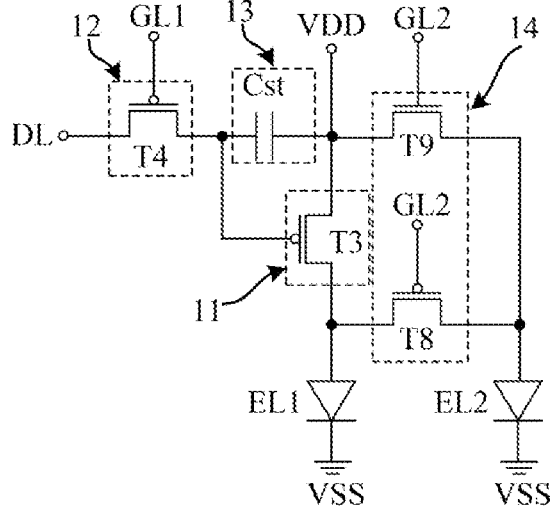
FIG. 23 is a equivalent circuit diagram of a pixel circuit according to at least one embodiment of the present disclosure.

FIG. 23 is an equivalent circuit diagram of a pixel circuit according to at least one embodiment of the present disclosure. In some examples, as shown in FIG. 23, the pixel circuit may be a 4T1C structure. The drive sub-circuit 11 may include a drive transistor T3, the data writing sub-circuit 12 may include a data writing transistor T4, the storage sub-circuit 13 may include a storage capacitor Cst, and the control sub-circuit 14 may include a first control transistor T8 and a second control transistor T9.

In some examples, as shown in FIG. 23, a gate of the data writing transistor T4 is electrically connected to the first scan line GL1, a first electrode of the data writing transistor T4 is electrically connected to the data line DL, and a second electrode of the data writing transistor T4 is electrically connected to a first electrode plate of the storage capacitor Cst1. A second electrode plate of the storage capacitor Cst is electrically connected to the first power supply line VDD. A gate of the drive transistor T3 is electrically connected to the first electrode plate of the storage capacitor Cst, a first electrode of the drive transistor T3 is electrically connected to the first power supply line VDD, and a second electrode of the drive transistor T3 is electrically connected to the first anode of the first light emitting unit EL1. A gate of the first control transistor T8 is electrically connected to the second scan line GL2, a first electrode of the first control transistor T8 is electrically connected to the first anode of the first light emitting unit EL1, and a second electrode of the first control transistor T8 is electrically connected to the second anode of the second light emitting unit EL2. A gate of the second control transistor T9 is electrically connected to the second scan line GL2, a first electrode of the second control transistor T9 is electrically connected to the first anode of the first light emitting unit EL1, and a second electrode of the second control transistor T9 is electrically connected to the second anode of the second light emitting unit EL2.

In some examples, the transistor types of the first control transistor T8 and the second control transistor T9 may be different. For example, the first control transistor T8 may be a P-type transistor, and the second control transistor T9 may be an N-type transistor; alternatively, the first control transistor T8 may be an N-type transistor, and the second control transistor T9 may be a P-type transistor. This embodiment is not limited thereto.

In some examples, as shown in FIG. 23, the drive transistor T3, the data writing transistor T4, and the first control transistor T8 are all P-type transistors, and the second control transistor T9 is an N-type transistor. In the anti-peep display mode, a second scan signal provided by the second scan line GL2 may be continuously a high level signal, so that the first control transistor T8 is turned off, and the drive transistor T3 may drive only the first light emitting unit EL1 to emit light under the control of the data signal; the second scan signal is a high level signal, so that the second control transistor T9 is turned on, and the second light emitting unit EL2 is driven to emit light.

In some examples, in the sharing display mode, the second scan signal provided by the second scan line GL2 may be a low level signal, the first control transistor T8 is turned on, and the second control transistor T9 is turned off, so that the drive transistor T3 can simultaneously drive the first light emitting unit EL1 and the second light emitting unit EL2 to emit light under the control of the data signal, that is, the second light emitting unit EL2 can emit light along with the first light emitting unit EL1. The process of driving the first light emitting unit EL1 to emit light by the pixel circuit of the present embodiment can be described with reference to the pixel circuit of the foregoing embodiment and is therefore not repeated here.

However, a structure of the control sub-circuit is not limited in the embodiments. In other examples, the types of the second control transistor and the first control transistor may be same, the gate of the second control transistor may be electrically connected to a third scan line, and a phase of a third scan signal provided by the third scan line may be reversed to a phase of the second scan signal provided by the second scan line. However, this embodiment is not limited thereto.

Figure 24:
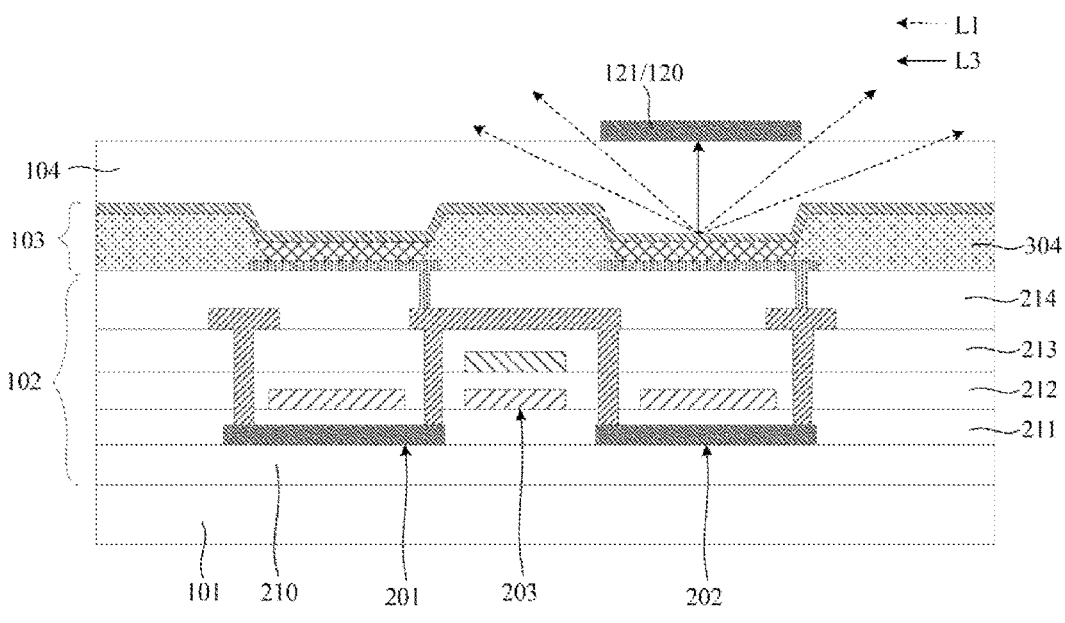
FIG. 24 is a partial cross-sectional schematic diagram of a light emitting element according to at least one embodiment of the present disclosure.

In some examples, an arrangement manner of the sub-pixels of the display area may be as shown in FIG. 3. The light emitting element of at least one sub-pixel may be divided into two light emitting units (e.g. a first light emitting unit and a second light emitting unit). FIG. 24 is a partial cross-sectional schematic diagram of a light emitting element according to at least one embodiment of the present disclosure. For example, FIG. 24 is a partial cross-sectional view along Q-Q' direction in FIG. 3. FIG. 24 illustrates a partial cross-sectional structure of the first light emitting unit and the second light emitting unit of the first sub-pixel.

In some examples, as shown in FIG. 24, in a direction perpendicular to the display panel, the display panel may include a base substrate 101, a display structure layer, an encapsulation structure layer 104 and a light blocking layer 120 sequentially disposed on the base substrate 101. The display structure layer includes a circuit structure layer 102 and a light emitting structure layer 103 which are sequentially disposed on the base substrate 101. The light blocking layer 120 may be disposed on a side of the encapsulation structure layer 104 away from the base substrate 101. In some examples, a color filter layer may also be provided on a side of the light blocking layer 120 away from the base substrate. However, this embodiment is not limited thereto.

In some examples, as shown in FIG. 24, the light blocking layer 120 may include a plurality of light blocking sections 121. An orthographic projection of the light blocking section 121 on the base substrate 101 may cover the orthographic projection of the light emitting region of the second light emitting unit on the base substrate 101. In this example, the first light emitting unit of the light emitting element may serve as a main light emitting unit, and the second light emitting unit may serve as an auxiliary light emitting unit. Since the light emitting region of the second light emitting unit is covered by the light blocking section 121, the emitted light of the second light emitting unit along the positive viewing direction is absorbed by the light blocking section 121, and the emitted light along the side viewing direction can be emitted. In FIG. 24, an emitted light L1 of the first sub-pixel P1 may be represented by a dash line with an arrow, and an emitted light L3 absorbed by the film layer in the display panel may be represented by a solid line with an arrow. In some examples, the material and manufacturing process of the light blocking layer 120 are similar to those of the first shielding layer described above, and therefore will not be repeated here.

In this example, the first light emitting unit of the light emitting element can emit light in a full viewing angle direction, and the second light emitting unit of the light emitting element is blocked by the light blocking layer and can emit light only along the side viewing angle direction. The display picture of the second light emitting unit cannot be seen by the user in the positive viewing angle direction. By setting the second light emitting units of a plurality of sub-pixels of the display panel to be all illuminated in the anti-peep display mode, a side-view user can see a white picture. In this way, only users in the positive viewing angle direction can see the normal display picture, and users in the side viewing angle direction can see the white picture, thus achieving the anti-peeping effect.

Figure 25A:
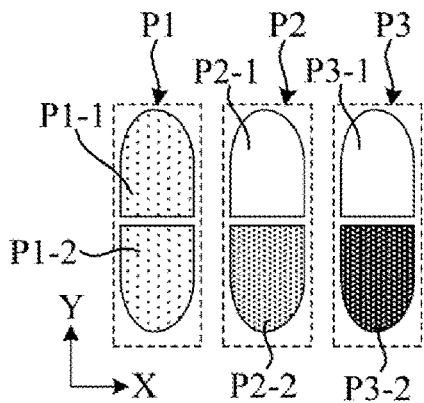
FIG. 25A is a schematic diagram of a monochrome picture of a display panel in the anti-peep display mode according to at least one embodiment of the present disclosure.
Figure 25B:
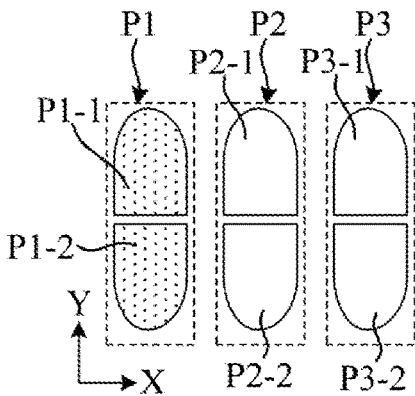
FIG. 25B is a schematic diagram of a monochrome picture of a display panel in the sharing display mode according to at least one embodiment of the present disclosure.

FIG. 25A is a schematic diagram of a monochrome picture of a display panel in the anti-peep display mode according to at least one embodiment of the present disclosure. FIG. 25B is a schematic diagram of a monochrome picture of a display panel in the sharing display mode according to at least one embodiment of the present disclosure. The monochrome pictures shown in FIGS. 25A and 25B are red pictures. FIGS. 25A and 25B are illustrated by taking one pixel unit as an example. As shown in FIG. 25A, in the anti-peep display mode, the first light emitting unit P1-1 and the second light emitting unit P1-1 of the first sub-pixel P1 may be illuminated, for example, the first light emitting unit P1-1 may emit light under the drive of the drive transistor of the pixel circuit, and the second light emitting unit P1-2 may emit light under the drive of the second control transistor. The first light emitting unit P2-1 of the second sub-pixel P2 and the first light emitting unit P3-1 of the third sub-pixel P3 are configured not to emit light; the second light emitting unit P2-2 of the second sub-pixel P2 and the second light emitting unit P3-2 of the third sub-pixel P3 may be configured to emit light. In this way, in the anti-peep display mode, the user in the positive viewing direction can see the red picture, and the user in the side viewing direction can see the white picture. As shown in FIG. 25B, in the sharing display mode, the first light emitting unit P1-1 of the first sub-pixel P1 is configured to emit light, and the second light emitting unit P1-2 may be configured to emit light along with the first light emitting unit P1-1. For example, the first light emitting unit P1-1 and the second light emitting unit P1-2 may emit light under the driving of the drive transistor. The first light emitting unit P2-1 and the second light emitting unit P2-2 of the second sub-pixel P2 and the first light emitting unit P3-1 and the second light emitting unit P3-2 of the third sub-pixel P3 do not emit light. The display mode of blue picture and green picture is similar, which therefore will not be repeated here.

Figure 26A:
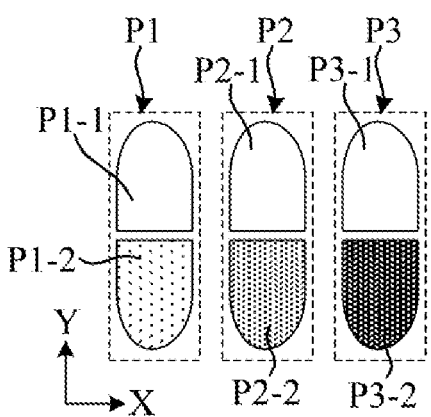
FIG. 26A is a schematic diagram of a black picture of a display panel in the anti-peep display mode according to at least one embodiment of the present disclosure.
Figure 26B:
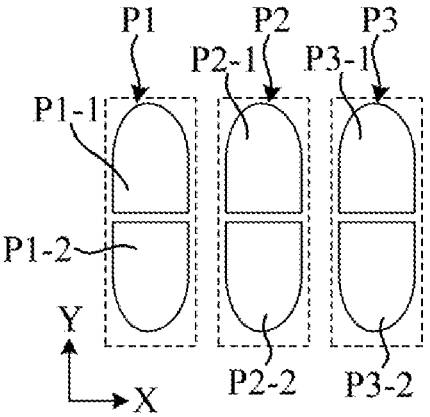
FIG. 26B is a schematic diagram of a black picture of a display panel in the sharing display mode according to at least one embodiment of the present disclosure.

FIG. 26A is a schematic diagram of a black picture of a display panel in the anti-peep display mode according to at least one embodiment of the present disclosure. FIG. 26B is a schematic diagram of a black picture of a display panel in the sharing display mode according to at least one embodiment of the present disclosure. FIGS. 26A and 26B are illustrated by taking one pixel unit as an example. As shown in FIG. 26A, in the anti-peep display mode, the first light emitting unit P1-1 of the first sub-pixel P1, the first light emitting unit P2-1 of the second sub-pixel P2, and the first light emitting unit P3-1 of the third sub-pixel P3 are all configured not to emit light. The second light emitting unit P1-2 of the first sub-pixel P1, the second light emitting unit P2-2 of the second sub-pixel P2, and the second light emitting unit P3-2 of the third sub-pixel P3 may all be configured to emit light. In this way, in the anti-peep display mode, the user in the positive viewing direction can see a black picture, and the user in the side viewing direction can see the white picture. As shown in FIG. 26B, in the sharing display mode, the first light emitting unit P1-1 and the second light emitting unit P1-2 of the first sub-pixel P1, the first light emitting unit P2-1 and the second light emitting unit P2-2 of the second sub-pixel P2, and the first light emitting unit P3-1 and the second light emitting unit P3-2 of the third sub-pixel P3 may all be configured not to emit light.

Figure 27:
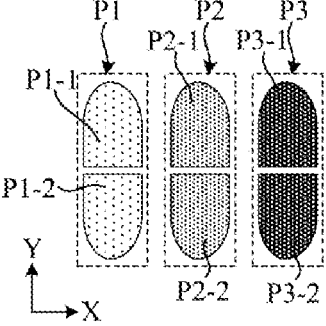
FIG. 27 is a schematic diagram of a white picture of a display panel in the anti-peep display mode according to at least one embodiment of the present disclosure.

FIG. 27 is a schematic diagram of a white picture of a display panel in the anti-peep display mode according to at least one embodiment of the present disclosure. FIG. 27 is illustrated by taking one pixel unit as an example. As shown in FIG. 27, in the anti-peep display mode, the first light emitting unit P1-1 and the second light emitting unit P1-2 of the first sub-pixel P1, the first light emitting unit P2-1 and the second light emitting unit P2-2 of the second sub-pixel P2, and the first light emitting unit P3-1 and the second light emitting unit P3-2 of the third sub-pixel P3 may all be configured to emit light. In this way, in the anti-peep display mode, the user in the positive viewing direction can see the white picture, and the user in the side viewing direction can see the white picture. In the sharing display mode, the first light emitting unit P1-1 and the second light emitting unit P1-2 of the first sub-pixel P1, the first light emitting unit P2-1 and the second light emitting unit P2-2 of the second sub-pixel P2, and the first light emitting unit P3-1 and the second light emitting unit P3-2 of the third sub-pixel P3 may all be configured to emit light.

The display panel of the present example controls the light emitting state of the second light emitting unit by providing the first control transistor and the second control transistor, and shields the light emitting region of the second light emitting unit by the light blocking layer, so that the second light emitting unit can keep in the light emitting state in the anti-peep display mode, so that the user in the side viewing direction can only see the white picture, thereby realizing the anti-peep effect.

The embodiment also provides a manufacturing method for the display panel, which includes the following steps: a display structure layer is formed on the base substrate, wherein the display structure layer includes a plurality of sub-pixels. At least one sub-pixel of the plurality of sub-pixels includes a pixel circuit and a light emitting element electrically connected with the pixel circuit. The light emitting element includes a first light emitting unit and a second light emitting unit; a light emitting region of the first light emitting unit and a light emitting region of the second light emitting unit are isolated from each other. The pixel circuit is configured to drive at least one of the first light emitting unit and the second light emitting unit to emit light in an anti-peep display mode.

Regarding the manufacturing method of the display panel in this embodiment, reference may be made to descriptions of the aforementioned embodiments, and thus will not be repeated here.

Figure 28:
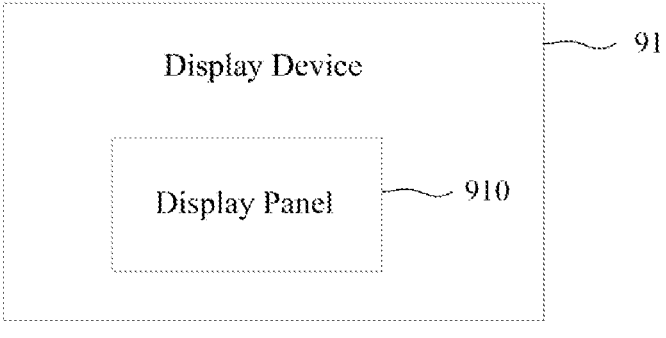
FIG. 28 is a schematic diagram of a display device according to at least one embodiment of the present disclosure.

FIG. 28 is a schematic diagram of a display device according to at least one embodiment of the present disclosure. In some examples, as shown in FIG. 28, this embodiment provides a display device 91 including a display panel 910 of the aforementioned embodiments. In some examples, the display panel 910 may be an OLED display substrate, a QLED display substrate, a Micro-LED display substrate, or a Mini-LED display substrate. The display device 91 may be any product or component with a display function, such as a mobile phone, a tablet computer, a television, a display, a laptop computer, a digital photo frame, and a navigator. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display panel, comprising: a base substrate, and a display structure layer disposed on the base substrate, wherein the display structure layer comprises a plurality of sub-pixels;

at least one sub-pixel of the plurality of sub-pixels comprises a pixel circuit and a light emitting element electrically connected with the pixel circuit, and the light emitting element comprises a first light emitting unit and a second light emitting unit;

a light emitting region of the first light emitting unit and a light emitting region of the second light emitting unit are isolated from each other; and the pixel circuit is configured to drive at least one of the first light emitting unit and the second light emitting unit to emit light in an anti-peep display mode;

wherein the display panel comprises: at least one shielding layer located on a light emitting side of the display structure layer;

an orthographic projection of the shielding layer on the base substrate is not overlapped with orthographic projections of the light emitting regions of the first light emitting unit and the second light emitting unit of the light emitting element on the base substrate; and the orthographic projection of the shielding layer on the base substrate surrounds the orthographic projection of the first light emitting unit of the light emitting element on the base substrate, or the orthographic projection of the shielding layer on the base substrate surrounds the orthographic projection of the light emitting element on the base substrate;

wherein the display panel comprises: a color filter layer located on a side of the at least one shielding layer away from the base substrate;

the color filter layer comprises a plurality of filter units arranged periodically and a black matrix located between adjacent filter units;

the plurality of filter units correspond to light emitting elements of the plurality of sub-pixels one by one.

2. The display panel according to claim 1, wherein the pixel circuit is configured to drive only the first light emitting unit to emit light in the anti-peep display mode, and to drive the second light emitting unit to emit light along with the first light emitting unit in a sharing display mode.

3. The display panel according to claim 1, wherein an area of the light emitting region of the first light emitting unit of the light emitting element is greater than or equal to an area of the light emitting region of the second light emitting unit.

4. The display panel according to claim 1, wherein, an orthographic projection of at least one of the plurality of filter units on the base substrate covers an orthographic projection of the light emitting element of the corresponding sub-pixel on the base substrate.

5. The display panel according to claim 1, further comprising: a light adjustment layer located on a side of the at least one shielding layer away from the base substrate, wherein the light adjustment layer comprises at least one lens unit, and an orthographic projection of the at least one lens unit on the base substrate is at least partially overlapped with an orthographic projection of the light emitting region of the first light emitting unit of the light emitting element on the base substrate.

6. The display panel according to claim 1, further comprising: a first protective layer and a second protective layer located on a side of the at least one shielding layer away from the base substrate; wherein the second protective layer is located on a side of the first protective layer close to the base substrate, a refractive index of the second protective layer is less than that of the first protective layer, an orthographic projection of the second protective layer on the base substrate is not overlapped with the light emitting region of the light emitting element, and an orthographic projection of the first protective layer on the base substrate covers the orthographic projection of the second protective layer on the base substrate.

7. The display panel according to claim 1, wherein, the display structure layer comprises an anode layer, wherein the anode layer comprises a first anode of the first light emitting unit of the light emitting element and a second anode of the second light emitting unit, both of the first anode and the second anode are electrically connected to the pixel circuit, and the first anode and the second anode are isolated from each other; and planes where the first anode and the second anode are located are flush, or the second anode is located on a side of the first anode away from the base substrate.

8. The display panel according to claim 1, wherein the display structure layer comprises an anode layer and a pixel definition layer located on a side of the anode layer away from the base substrate, and the pixel definition layer is provided with a plurality of pixel openings exposing at least a portion of a surface of the anode layer, the pixel definition layer is black.

9. The display panel according to claim 1, wherein a spacing between the first light emitting unit and the second light emitting unit of the light emitting element of the at least one sub-pixel is less than a spacing between the light emitting elements of adjacent sub-pixels emitting light of different colors.

10. The display panel according to claim 1, wherein the light emitting elements of the plurality of sub-pixels are arranged in an array, and the first light emitting unit and the second light emitting unit of the light emitting element of the sub-pixels emitting the same color light are alternately arranged along a first direction and alternately arranged along a second direction, the first direction intersects the second direction.

11. The display panel according to claim 1, wherein the pixel circuit at least comprises: a data writing sub-circuit, a storage sub-circuit, a drive sub-circuit, and a control sub-circuit;

the data writing sub-circuit is electrically connected to a data line, a first scan line, and the drive sub-circuit, and is configured to supply a data signal transmitted by the data line to the drive sub-circuit under the control of the first scan line;

the drive sub-circuit is electrically connected with the data writing sub-circuit, the storage sub-circuit, the control sub-circuit and the first light emitting unit of the light emitting element, and is configured to drive the first light emitting unit to emit light under the control of the data signal; and the control sub-circuit is electrically connected a second scan line, the drive sub-circuit, the first light emitting unit and the second light emitting unit of the light emitting element, and is configured to control the second light emitting unit along with the first light emitting unit to emit light under the control of the second scan line.

12. The display panel according to claim 11, wherein the control sub-circuit comprises a first control transistor; and a gate of the first control transistor is electrically connected with the second scan line, a first electrode of the first control transistor is electrically connected with the first light emitting unit, and a second electrode of the first control transistor is electrically connected with the second light emitting unit.

13. The display panel according to claim 1, wherein the pixel circuit of the at least one sub-pixel is configured, in the anti-peep display mode, to drive only the second light emitting unit to emit light, or to drive the first light emitting unit and the second light emitting unit to emit light separately; and in the sharing display mode, to drive the second light emitting unit along with the first light emitting unit to emit light.

14. The display panel according to claim 13, further comprising: a light blocking layer located on a light emitting side of the display structure layer, wherein the light blocking layer comprises at least one light blocking section, and an orthographic projection of the light blocking section on the base substrate covers an orthographic projection of the light emitting region of the second light emitting unit on the base substrate.

15. The display panel according to claim 14, wherein the plurality of sub-pixels comprise a first sub-pixel that emits a first color light, a second sub-pixel that emits a second color light, and a third sub-pixel that emits a third color light; and in the anti-peep display mode, the second light emitting units of the light emitting elements of the first sub-pixel, the second sub-pixel and the third sub-pixel are all configured to emit light.

16. The display panel according to claim 13, wherein the pixel circuit at least comprises: a data writing sub-circuit, a storage sub-circuit, a drive sub-circuit, and a control sub-circuit;

the data writing sub-circuit is electrically connected to a data line, a first scan line, and the drive sub-circuit, and is configured to supply a data signal transmitted by the data line to the drive sub-circuit under the control of the first scan line;

the drive sub-circuit is electrically connected with the data writing sub-circuit, the storage sub-circuit, the control sub-circuit and the first light emitting unit of the light emitting element, and is configured to drive the first light emitting unit to emit light under the control of the data signal; and the control sub-circuit is electrically connected with a second scan line, a first power supply line, the drive sub-circuit, the first light emitting unit and the second light emitting unit of the light emitting element, and is configured to control the second light emitting unit along with the first light emitting unit to emit light under the control of the second scan line, or to drive the second light emitting unit to emit light; wherein the control sub-circuit comprises a first control transistor and a second control transistor;

a gate of the first control transistor is electrically connected with the second scan line, a first electrode of the first control transistor is electrically connected with the first light emitting unit, and a second electrode of the first control transistor is electrically connected with the second light emitting unit;

a gate of the second control transistor is electrically connected with the second scan line, a first electrode of the second control transistor is electrically connected with the first power supply line, and a second electrode of the second control transistor is electrically connected with the second light emitting unit; and the second control transistor and the first control transistor are different in transistor type.

17. A display device, comprising the display panel according to claim 1.

18. A manufacturing method for a display panel, which is used for manufacturing the display panel of claim 1, wherein the method comprises: forming a display structure layer on a base substrate, wherein the display structure layer comprises a plurality of sub-pixels;

at least one sub-pixel of the plurality of sub-pixels comprises a pixel circuit and a light emitting element electrically connected with the pixel circuit, and the light emitting element comprises a first light emitting unit and a second light emitting unit;

a light emitting region of the first light emitting unit and a light emitting region of the second light emitting unit are isolated from each other; and the pixel circuit is configured to drive at least one of the first light emitting unit and the second light emitting unit to emit light in an anti-peep display mode.

* * * * *